United States Patent
Madhavkant

(10) Patent No.: US 12,317,443 B2
(45) Date of Patent: May 27, 2025

(54) SELF-STANDING MODULAR DATA CENTER INFRASTRUCTURE SYSTEM

(71) Applicant: Amazon Technologies, Inc., Seattle, WA (US)

(72) Inventor: Mayankant Madhavkant, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 224 days.

(21) Appl. No.: 17/810,576

(22) Filed: Jul. 1, 2022

(65) Prior Publication Data

US 2022/0338365 A1    Oct. 20, 2022

Related U.S. Application Data

(63) Continuation of application No. 16/368,713, filed on Mar. 28, 2019, now Pat. No. 11,382,232.

(51) Int. Cl.
    *H05K 7/14*    (2006.01)
(52) U.S. Cl.
    CPC ......... *H05K 7/1487* (2013.01); *H05K 7/1401* (2013.01); *H05K 7/1489* (2013.01); *H05K 7/1492* (2013.01)
(58) Field of Classification Search
    None
    See application file for complete search history.

(56) References Cited

U.S. PATENT DOCUMENTS

| | | |
|---|---|---|
| 7,430,118 B1 | 9/2008 | Noteboom et al. |
| 8,238,082 B2 | 8/2012 | Salpeter |
| 9,332,670 B1 | 5/2016 | Eichelberg |
| 9,357,681 B2 | 5/2016 | Ross et al. |
| 9,585,282 B1 | 2/2017 | Gandhi et al. |
| 9,606,316 B1 | 3/2017 | Gandhi |
| 9,760,098 B1 | 9/2017 | Imwalle et al. |
| 9,888,614 B1 | 2/2018 | Ross et al. |
| 10,028,415 B1 * | 7/2018 | Roy ............... H05K 7/20745 |
| 10,061,097 B2 | 8/2018 | Morales et al. |
| 10,098,248 B1 * | 10/2018 | Klinger ............. H05K 7/1495 |
| 10,240,339 B1 | 3/2019 | Dominguez |
| 10,244,652 B1 | 3/2019 | Czamara et al. |
| 10,271,462 B1 | 4/2019 | Ross et al. |
| 10,502,918 B1 | 12/2019 | Morales et al. |
| 10,834,838 B1 | 11/2020 | Ross et al. |
| 11,032,948 B1 | 6/2021 | Ross et al. |

(Continued)

FOREIGN PATENT DOCUMENTS

AU    2015263947 A1 * 12/2016 ......... H05K 7/20145

*Primary Examiner* — James Wu
*Assistant Examiner* — Christopher L Augustin
(74) *Attorney, Agent, or Firm* — Alexander A. Knapp; Kowert, Hood, Munyon, Rankin & Goetzel, P.C.

(57) ABSTRACT

A self-standing data center infrastructure system includes a bottom frame and a collapsible top frame that are configured to be inserted into a standard shipping container for transport to a data center location. At the data center location, the bottom frame is secured to a floor of the data center and the top frame is mounted as a pre-assembled unit on the bottom frame. The top frame is then expanded to provide infrastructure support to one or more rows of racks. Also, the racks may be secured to the bottom frame without the need for additional anchoring of the racks.

20 Claims, 18 Drawing Sheets

(56) References Cited

U.S. PATENT DOCUMENTS

| | | |
|---|---|---|
| 11,382,232 B1 | 7/2022 | Madhavkant |
| 2004/0135479 A1 | 7/2004 | Haselby et al. |
| 2005/0241802 A1 | 11/2005 | Malone et al. |
| 2005/0258721 A1 | 11/2005 | Hung |
| 2006/0139877 A1 | 6/2006 | Germagian |
| 2008/0024977 A1 | 1/2008 | Coglitore |
| 2008/0126699 A1 | 5/2008 | Sangapu et al. |
| 2008/0174954 A1 | 7/2008 | VanGilder |
| 2008/0180908 A1 | 7/2008 | Wexler |
| 2008/0144375 A1 | 11/2008 | Cheng |
| 2009/0061755 A1 | 3/2009 | Calder |
| 2009/0086434 A1 | 4/2009 | Hodes |
| 2009/0122484 A1 | 5/2009 | Caveney |
| 2009/0138313 A1 | 5/2009 | Morgan et al. |
| 2009/0251860 A1 | 10/2009 | Belady |
| 2009/0296342 A1 | 12/2009 | Matteson et al. |
| 2010/0003911 A1 | 1/2010 | Graczyk et al. |
| 2010/0149754 A1 | 6/2010 | Chapel |
| 2010/0223085 A1 | 9/2010 | Gauthier |
| 2010/0263830 A1 | 10/2010 | Noteboom |
| 2011/0063778 A1 | 3/2011 | Brouillard |
| 2011/0128699 A1 | 6/2011 | Heydari |
| 2011/0213735 A1 | 9/2011 | Cao et al. |
| 2011/0223849 A1 | 9/2011 | Ishimine |
| 2011/0242755 A1 | 10/2011 | Zeighami |
| 2012/0063082 A1 | 3/2012 | Chang |
| 2012/0063087 A1 | 3/2012 | Wei |
| 2012/0162883 A1 | 6/2012 | Jai |
| 2012/0200206 A1 | 8/2012 | Schmitt |
| 2012/0243157 A1 | 9/2012 | Chen |
| 2012/0274193 A1 | 11/2012 | Qin |
| 2012/0274194 A1 | 11/2012 | Qin |
| 2013/0120931 A1 | 5/2013 | Sankar |
| 2013/0138253 A1 | 5/2013 | Chainer |
| 2013/0190899 A1 | 7/2013 | Slessman et al. |
| 2013/0232888 A1 | 9/2013 | Crosby |
| 2013/0233532 A1 | 9/2013 | Imwalle et al. |
| 2013/0286587 A1 | 10/2013 | Martini |
| 2014/0033751 A1 | 2/2014 | Bailey et al. |
| 2014/0059945 A1 | 3/2014 | Gardner et al. |
| 2015/0282377 A1 | 10/2015 | Hilburn et al. |
| 2018/0058086 A1 | 3/2018 | Hubbard et al. |
| 2019/0159358 A1 | 5/2019 | Chen et al. |

* cited by examiner

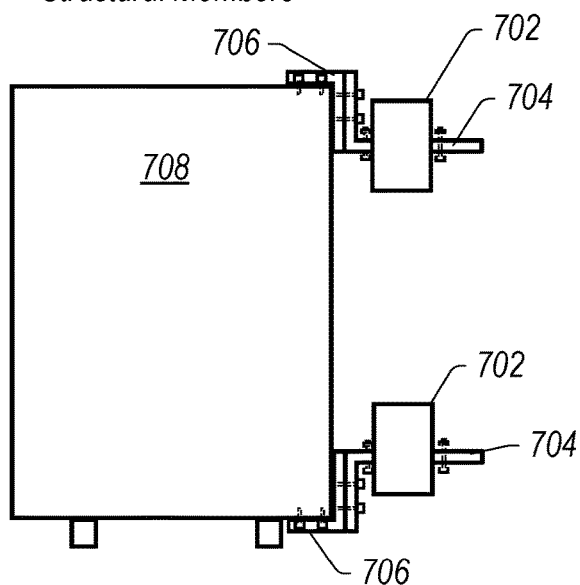
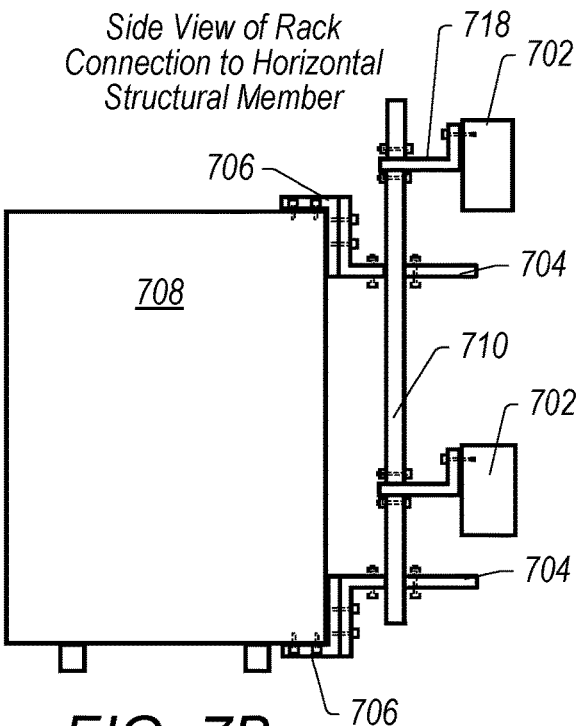
FIG. 7A
FIG. 7B
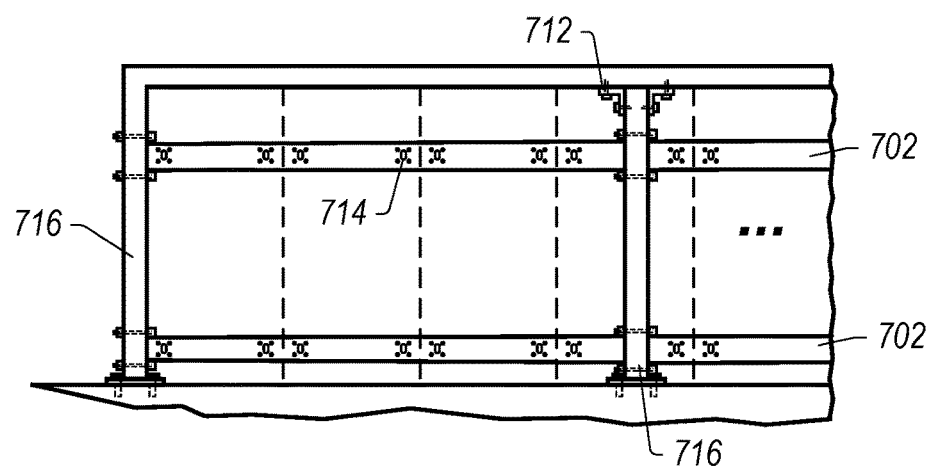
FIG. 7C

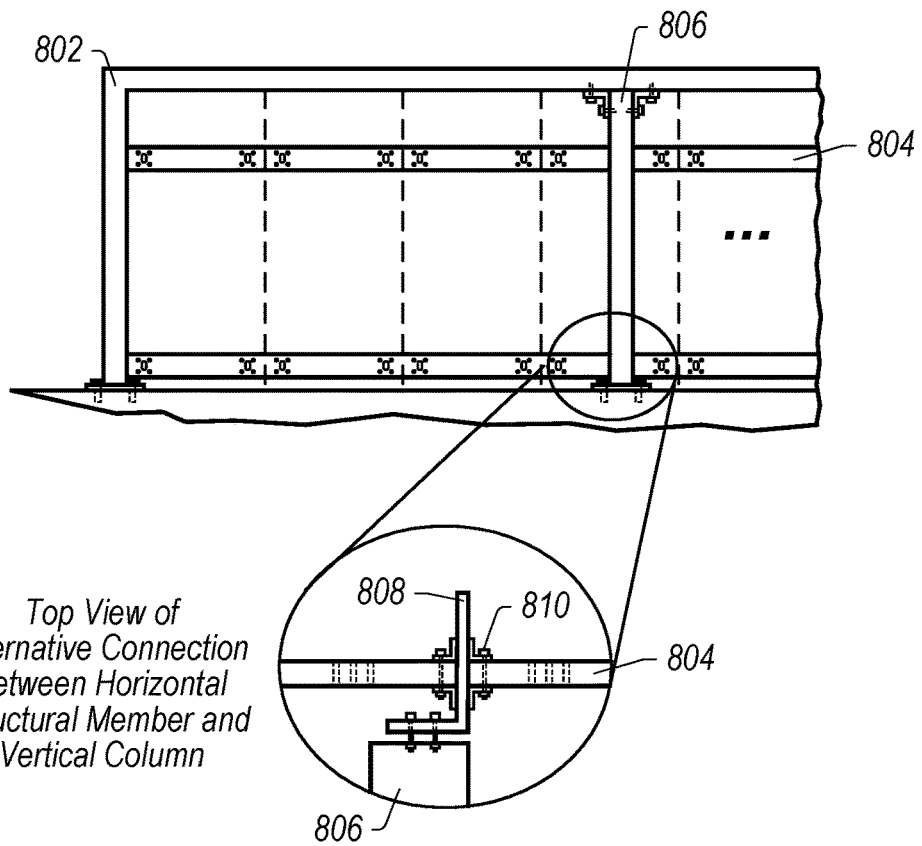
FIG. 8
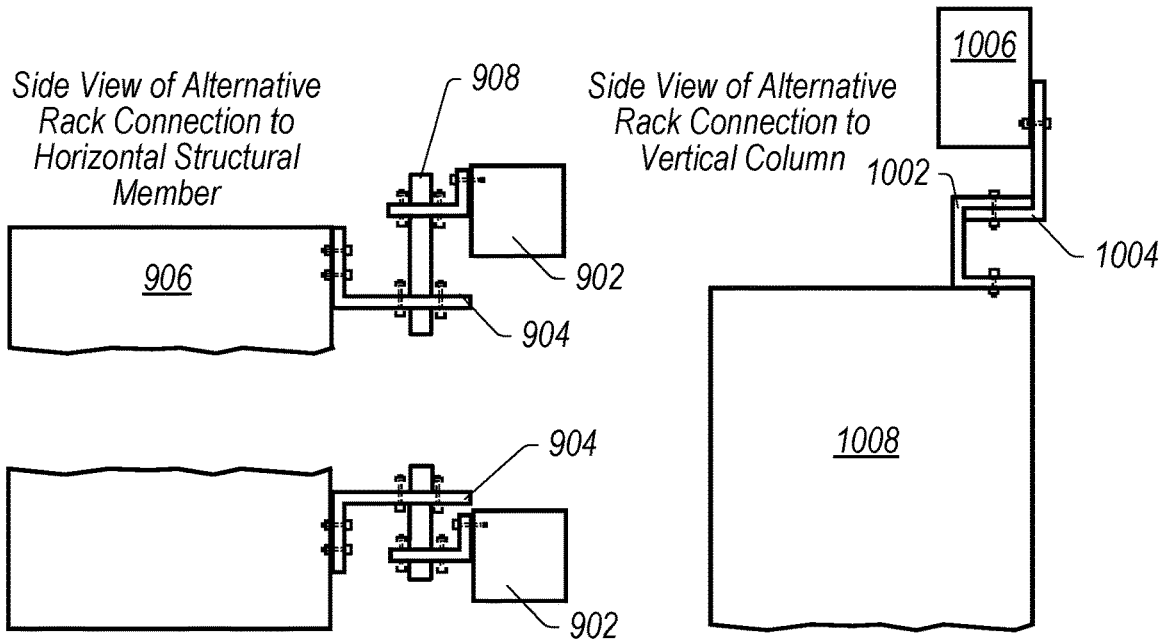
FIG. 9
FIG. 10

Side View of Alternative
Rack Connection to
Vertical Column

Side View of Alternative
Rack Connection to
Vertical Column

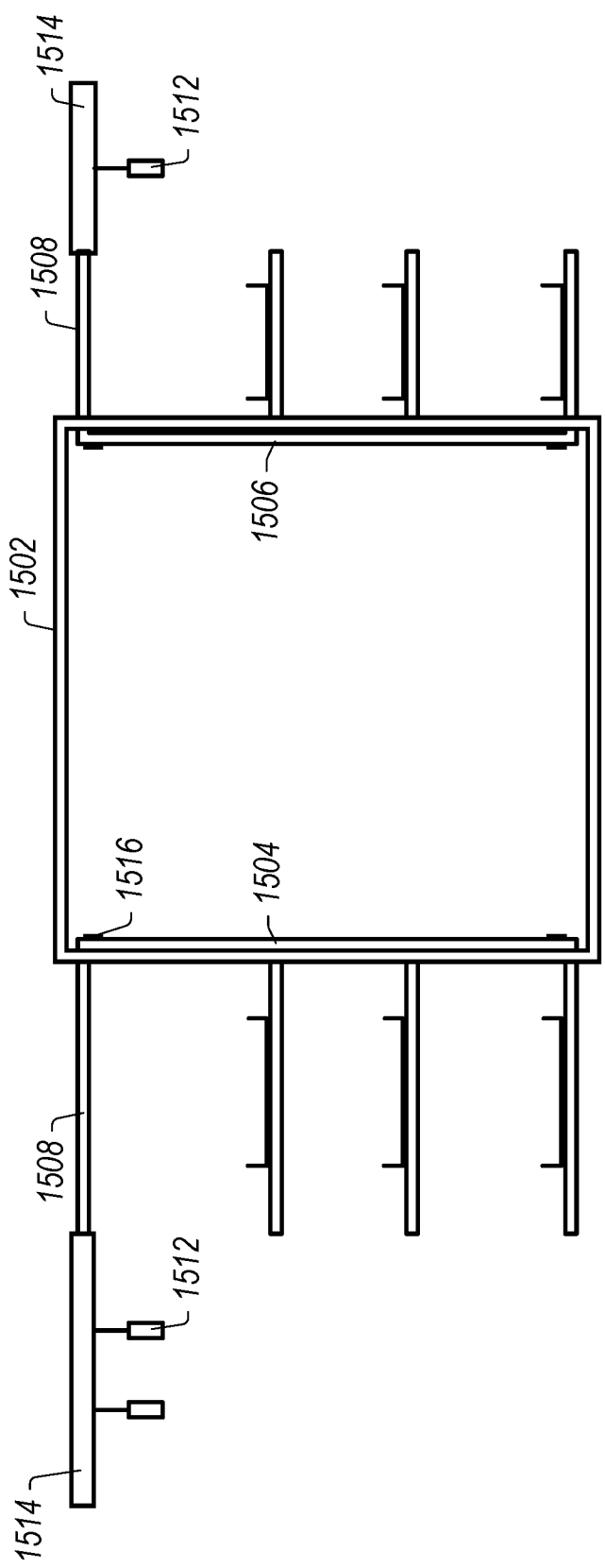

SELF-STANDING MODULAR DATA CENTER INFRASTRUCTURE SYSTEM

This application is a continuation of U.S. patent application Ser. No. 16/368,713, filed Mar. 28, 2019, which is hereby incorporated by reference herein in its entirety.

BACKGROUND

Organizations such as on-line retailers, Internet service providers, search providers, financial institutions, universities, and other computing-intensive organizations often conduct computer operations from large scale computing facilities. Also, such organizations, or smaller organizations, may outsource computer operations to a computing or storage service provider that operates large scale computing facilities. Such large-scale computing facilities house and accommodate a large amount of server, network, and additional computer equipment to process, store, and exchange data. Typically, a computer room of a computing facility includes many server racks organized into rows with aisles between the rows of server racks. Each server rack, in turn, includes many servers and/or other associated computer equipment.

The amount of computing capacity needed for any given facility, such as a data center, may change rapidly as business needs dictate. Most often, there is a need for increased capacity at a data center location, or a need for new data center locations. Initially providing computing or storage capacity in a facility, such as a data center, or expanding the existing capacity of a facility (in the form of additional servers, for example) is resource-intensive and may take many months to implement. Substantial amounts of time and skilled labor are typically required to design and build data center infrastructure (or expand data center infrastructure). Often data center infrastructure is installed on-site, wherein data center infrastructure components are installed sequentially by different specialized crafts people.

BRIEF DESCRIPTION OF THE DRAWINGS

FIG. 7A illustrates a side view of another arrangement of clips that attach a rack to a bottom frame of a self-standing data center infrastructure system, according to some embodiments.

FIG. 7B illustrates a side view of another arrangement of clips that attach a rack to a bottom frame of a self-standing data center infrastructure system, according to some embodiments.

FIG. 7C illustrates a side view of a bottom frame of a self-standing data center infrastructure system that includes vertical columns and horizontal structural members configured to secure racks in place, according to some embodiments.

FIG. 8 illustrates a top sectional view of another example connection between a horizontal structural member of a bottom frame of a self-standing data center infrastructure system and a vertical support column, according to some embodiments.

FIG. 9 illustrates a side view of another arrangement of clips that attach a rack to a bottom frame of a self-standing data center infrastructure system, according to some embodiments.

FIG. 10 illustrates a side view of another arrangement of clips that attach a rack to a bottom frame of a self-standing data center infrastructure system or to a vertical support column attached to the bottom frame, according to some embodiments.

FIG. 15B illustrates an end view of a top frame of a self-standing data center infrastructure system, wherein the top frame is in an expanded configuration, according to some embodiments.

Figure 1A:
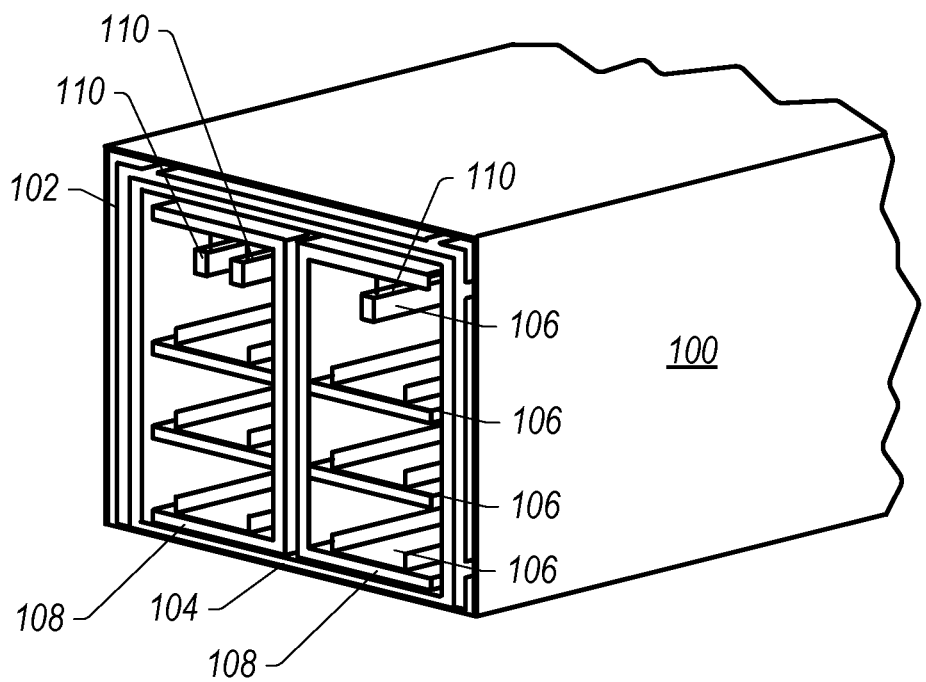
FIG. 1A illustrates a perspective view of a bottom frame and a top frame of a self-standing modular data center infrastructure system, wherein the top frame is in a collapsed configuration and placed inside the bottom frame, and wherein the top frame and the bottom frame are loaded in a shipping container, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a self-standing modular data center infrastructure system are disclosed. Also, methods of transporting and installing a self-standing modular data center infrastructure system are disclosed, as well as arrangements of facilities that include self-standing modular data center infrastructure systems, such as data centers. For simplicity, a self-standing modular data center infrastructure system may be referred to herein simply as a self-standing data center infrastructure system, a data center infrastructure system, a modular data center infrastructure system, or other similar descriptions.

According to some embodiments, a method of installing infrastructure at a data center location includes receiving, at the data center location, a shipping container comprising a modular data center infrastructure system, wherein the modular data center infrastructure system comprises a bottom frame structure configured to mount on a floor at the data center location and a top frame structure configured to mount on the bottom frame structure. The top frame structure includes a static frame configured to mount on the bottom frame structure, moveable frame elements coupled to the static frame and configured to translate between a collapsed configuration and an expanded configuration, one or more cable trays mechanically coupled to the moveable frame elements, and one or more power busways mechanically coupled to the moveable frame elements. The method further includes securing the bottom frame structure to the floor at the data center location, mounting the top frame structure on the bottom frame structure, and expanding the moveable frame elements of the top frame structure such that the one or more cable trays and the one or more power busways are configured to provide cable support and power support for a data center aisle or row(s) at the data center location.

For example, a top frame structure of a modular data center infrastructure system may be collapsed to fit into a standard shipping container, along with a bottom frame structure and/or other components of the modular data center infrastructure system, such as mounting bolts, clips, etc. The bottom frame structure may be removed from the standard shipping container and positioned in a location for a hot aisle in a data center. Continuing the example, the bottom frame structure may be anchored to the floor of the data center using one or more anchoring mechanisms, such as expanding anchoring bolts or pre-set anchoring bolts. The top frame structure may also be removed from the standard shipping container while in a collapsed configuration, and mounted on the bottom frame structure that has been secured to the floor of the data center. The top frame structure may then be secured to the bottom frame structure and expanded to provide infrastructure support to rows of rack mounted computing systems on either side of the installed and expanded modular data center infrastructure system. Also, the rack mounted computing systems may be secured to the bottom frame structure of the modular data center infrastructure system without a need for installing additional anchoring mechanisms to secure the rack mounted computing systems to the floor of the data center. For example, clips and/or bolts may be used to secure racks of the rack mounted computing systems to the bottom frame structure of the modular data center infrastructure system. A power busway of the top frame structure may be used to supply power to the rack mounted computing systems and the one or more cable trays may support cables, such as networking cables, that are used to connect the rack mounted computing systems to a network of the data center. In a similar manner, other infrastructure components, such as networking cables, fire suppression, lighting, building management control, air containment, air distribution, etc. may be included in a modular data center infrastructure system and may be used to support data center rows or aisles associated with the modular data center infrastructure system.

According to some embodiments, a method includes providing a data center infrastructure system and transporting the data center infrastructure system to a data center location in a standard shipping container. The data center infrastructure system includes a bottom frame configured to mount on a floor at the data center location and a top frame configured to mount on the bottom frame. The top frame includes a static frame configured to mount on the bottom frame structure, moveable frame elements coupled to the static frame and configured to translate between a collapsed configuration and an expanded configuration, and one or more infrastructure systems mechanically coupled to the moveable frame elements. The top frame is transported to the data center location in the standard shipping container in a collapsed configuration.

In some embodiments, the bottom frame is transported in the standard shipping container along with the top frame. In some embodiments, the bottom frame is transported in the standard shipping container along with the top frame as a single piece or may be transported in the standard shipping container in multiple pieces that are assembled at the data center location. In some embodiments, more than one standard shipping container may be used to transport the top and bottom frame.

According to some embodiments, a data center infrastructure system includes a bottom frame structure configured to be mounted on a floor of a data center and a top frame structure configured to mount on the bottom frame structure. The top frame structure includes a static frame configured to mount on the bottom frame structure, moveable frame elements coupled to the static frame and configured to translate between a collapsed configuration and an expanded configuration, and one or more infrastructure systems mechanically coupled to the moveable frame elements. The top frame structure when mounted on the bottom frame structure forms a free-standing structure in the data center that provides data center infrastructure support to one or more rows of rack mounted computing systems and/or an aisle between rows of rack mounted computing systems.

As used herein, an "aisle" means a space next to one or more racks, such as a space between rows of racks. An "aisle" may be a "hot aisle" that encompasses a space between rows of racks that receives air that has been heated by heat producing components of computing devices in the rows of racks, such as rack mounted computing systems. Also, an aisle may be a "cold aisle" that encompasses a space between rows of racks that is provided cool air to be passed through computing devices in the rows of racks to remove heat from heat producing components in the computing devices. Also, an aisle may be a space or walkway in a data center that connects other aisles, such as an aisle running perpendicular to a plurality of cold aisles. In some embodiments, an aisle may be between a row of racks and a wall of data center, such as a first or last aisle of a set of aisles in a computing room.

As used herein, "computing system" includes any of various computer systems or components thereof. One example of a computing system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random-access memory (RAM). As used herein a "computing system" may also refer to data storage systems, such as storage servers, as well as networking systems, such as routers, switches, etc.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, a "module" is a component or a combination of components physically coupled to one another. A module may include functional elements and systems, such as power distribution systems, networking systems, fire suppression systems, and/or control systems, as well as structural elements, such a frame, housing, structure, container, etc. In some embodiments, a module is pre-assembled at a location off-site from a data center.

Typically, data center infrastructure is installed in a data center prior to rack mounted computing devices being installed in the data center. Also, typically the data center infrastructure is assembled on site at the data center by various skilled workers, wherein the skilled workers complete tasks sequentially. For example, a first group of skilled workers may install framing and another group of skilled workers, such as electricians, may install power busways. Yet another group of skilled workers may install lighting. Additionally, other groups of skilled workers may install cable trays, networking cables, fire suppression systems, building management systems, air containment systems, air distribution systems, etc. Since there is a limited amount of space in a data center for multiple groups of skilled workers to simultaneously complete various tasks, different groups of skilled workers typically complete tasks after previous groups of skilled workers have completed earlier tasks while other groups of skilled workers wait on a current group of skilled workers to finish tasks currently being performed. The tasks to be completed by each set of workers forms a "critical path" for the completion of the data center, wherein tasks in the critical path add to the overall amount of time required to complete construction and commissioning of the data center. When tasks can be completed ahead of time or concurrently with other tasks, the critical path may be shortened, meaning that the completion and commissioning of the data center may be performed in a shorter amount of time.

In some embodiments, a critical path for construction and commissioning of a data center may be significantly shortened by using a self-standing modular data center infrastructure system to provide infrastructure support to rows of racks and aisles between the rows of racks. For example, a top frame structure and/or a bottom frame structure of a self-standing modular data center infrastructure system may be fabricated off-site from a data center location. Also, the top and/or bottom frame structures of the self-standing modular data center infrastructure system may be fabricated outside of the critical path timeline. For example, a top frame structure and/or a bottom frame structure of a self-standing modular data center infrastructure system may be fabricated prior to construction of a data center or in parallel with other activities involved in constructing a data center. In some embodiments, the use of pre-fabricated top and/or bottom frame structures of a self-standing modular data center infrastructure system may shorten a critical path for construction of a data center. Also, efficiencies of scale may be realized wherein several self-standing modular data center infrastructure systems (e.g., top and bottom frame structures) are fabricated off-site using an assembly line or other manufacturing techniques.

In some embodiments, top and/or bottom frame structures of a self-standing modular data center infrastructure system may be re-used, thus reducing waste. For example, in some embodiments, a top and/or bottom frame structure of a self-standing modular data center infrastructure system may be relocated from a data center that is being de-commissioned to a new or other data center for re-use in the new or other data center.

In some embodiments, a self-standing modular data center infrastructure system may be collapsible and expandable. For example, data center row infrastructure (e.g., assembled cable trays, power busways, etc.) take up a large volume of space that is larger than most standardized shipping methods, such as ISO shipping containers (e.g., shipping containers that conform to the International Standards Organization standards for intermodal shipping container or other types of shipping containers). However, a self-standing modular data center infrastructure system may allow the pre-assembled data center infrastructure to be collapsed such that the collapsed data center infrastructure fits in a standardized shipping container, such as an ISO (International Standards Organization compliant) shipping container. For example, a top frame structure of a self-standing modular data center infrastructure system may include moveable frame elements that are configured to be moved into a collapsed configuration. Also, a bottom frame structure of a self-standing modular data center infrastructure system may be a separate component from the top frame structure. Also, the bottom frame structure and the top frame structure may be configured such that the top frame structure fits within the bottom frame structure, when the top frame structure is in a collapsed configuration, and when the top and bottom frame structures are loaded into a standard shipping container, such as an ISO shipping container.

Once at a data center location under construction, a bottom frame structure and a collapsed top frame structure of a self-standing modular data center infrastructure system may be removed from the standard shipping container (after being transported to the data center location in the shipping container). The top frame structure may be mounted on the bottom frame structure to form a self-standing structure, and the top frame structure may be expanded to provide data center infrastructure support to rows of rack mounted computing systems at the data center location and to aisles between the rows.

In some embodiments, the bottom frame structure includes one or more foot plates that are configured to accept anchoring mechanisms, such as bolts, to secure the bottom frame structure to a floor at the data center location. In some embodiments, the bottom frame structure includes one or more horizontal structural members running along a length of the bottom frame structure. The horizontal frame structures may be configured to couple with racks for rack-mounted computing systems, and may be configured to secure the racks in place. In some embodiments, the racks may be secured in place via the bottom frame structure without using any additional anchoring mechanisms to directly secure the racks to the floor at the data center location. For example, a rack may be bolted or otherwise affixed to a horizontal structural member of a bottom frame structure without the rack also being bolted to the floor of the data center. In some embodiments, a rack may be coupled to both an upper horizontal structural member and a lower horizontal structural member of a bottom frame structure such that the rack is secured at multiple locations along the height of the rack. In some embodiments, various arrangements of clips as discussed in more detail in FIGS. 6-12 may be used to secure a rack to a bottom frame structure. In some embodiments, clips may attach racks to a horizontal structural members of a bottom frame structure, or clips may be used to attach racks to a bottom frame structure via connections to vertical columns of the bottom frame structure, or both.

FIG. 1A illustrates a perspective view of a bottom frame and a top frame of a self-standing modular data center infrastructure system, wherein the top frame is in a collapsed configuration and placed inside the bottom frame, and wherein the top frame and the bottom frame are loaded in a shipping container, according to some embodiments.

In some embodiments, components of a self-standing data center infrastructure module may be fabricated off-site from a data center location, or may be fabricated at a location near the data center location, but outside of the critical path for construction of a data center at the data center location. The pre-fabricated components of the self-standing data center infrastructure system may be transported to a location where the self-standing data center infrastructure system is to be installed, wherein the pre-fabricated components are transported in a standard shipping container, such as a shipping container conforming to Internal Standards Organization (ISO) standards. In some embodiments, other shipping methods may be used such as a trailer, etc.

For example, FIG. 1A illustrates components of a self-standing data center infrastructure system that have been loaded into a standard shipping container to be transported to a destination location, such as a data center location, where the self-standing data center infrastructure system is to be installed. For example, shipping container 100 includes bottom frame structure 102 loaded into the shipping container 100. Shipping container 100 also includes top frame structure 104 loaded into the shipping container 100 and placed within bottom frame structure 102. Infrastructure systems 106 are mechanically coupled to moveable frame elements 108 of top frame structure 104, wherein the moveable frame elements 108 (and the infrastructure systems 106 mechanically coupled to the moveable frame elements 108) are in a collapsed configuration. In some embodiments, the infrastructure systems 106 may include a power bus busway or bus duct, one or more cable trays, networking cables, fire suppression components, lighting components, building management control components, air containment panels, air distribution components, etc.

In some embodiments a top frame structure and/or the infrastructure systems mechanically coupled to moveable frame elements of the top frame structure may have different configurations. For example, some infrastructure systems that are shared by two or more rows of racks may be included in a self-standing data center infrastructure system, wherein the shared infrastructure systems are coupled to either of two sets of moveable frame elements on either side of the top frame structure. For example, top frame structure 104 includes two power busways 110 mechanically coupled to moveable frame elements 108 on the left side of the top frame structure 104 (as depicted in FIG. 1A) and a single power busway 110 mechanically coupled to moveable frame elements 108 on the right side of the top frame structure 104 (as depicted in FIG. 1A). In some embodiments, self-standing data center infrastructure systems deployed adjacent to one another may span an aisle between rows of racks and may provide infrastructure support to rows of racks on either side of the aisle. For example, adjacently deployed self-standing data center infrastructure systems may provide three power busways that run along an aisle between rows of racks. In some embodiments, one of the power busways may provide primary power support for one of the rows of racks, another one of the power busways may provide primary power support for the other one of the rows of racks, and the third power busway may be a shared reserve power busway which provides reserve power support to both of the rows of racks on either side of the aisle. In some embodiments, adjacent self-standing data center infrastructure systems may include other shared infrastructure systems, such as lighting, fire prevention/suppression, building management sensors, etc.

Figure 1B:
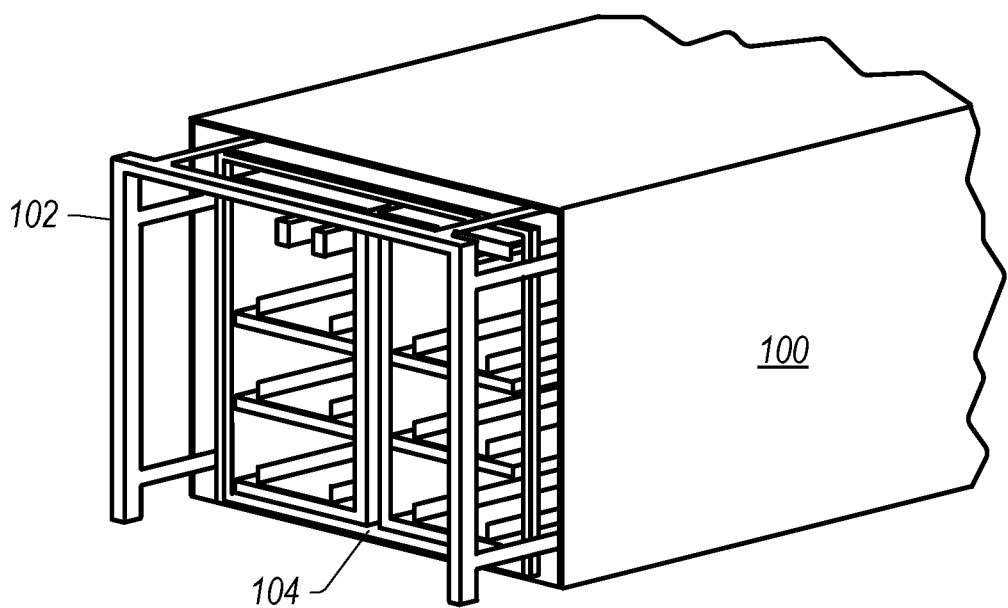
FIG. 1B illustrates a perspective view of a bottom frame of a self-standing modular data center infrastructure system being removed from a shipping container, according to some embodiments.

FIG. 1B illustrates a perspective view of a bottom frame of a self-standing modular data center infrastructure system being removed from a shipping container, according to some embodiments.

As shown in FIG. 1B, the bottom frame structure 102 may be individually removed from the shipping container 100. For example, a forklift or other device may couple with the bottom frame structure 102 to remove it from the shipping container 100.

Figure 1C:
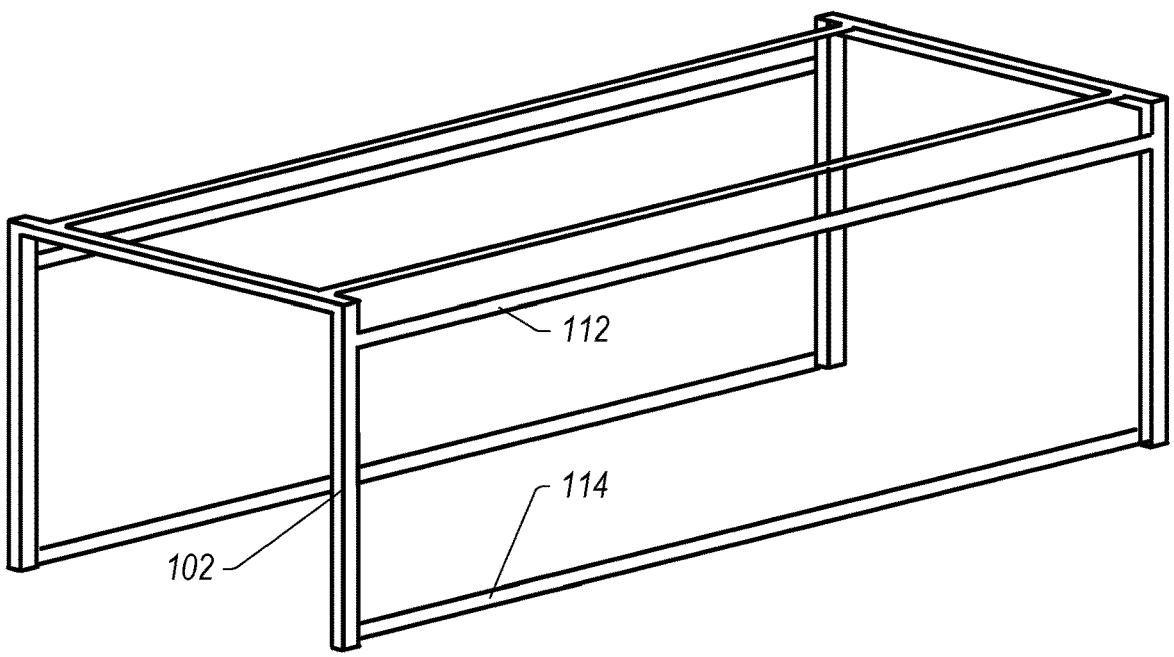
FIG. 1C illustrates a perspective view of a bottom frame of a self-standing modular data center infrastructure system that has been removed from a shipping container, according to some embodiments.

FIG. 1C illustrates a perspective view of a bottom frame of a self-standing modular data center infrastructure system that has been removed from a shipping container, according to some embodiments.

The bottom frame structure 102 has been removed from shipping container 100 and secured to a floor of a data center location. In some embodiments, various anchoring mechanisms as discussed in more detail in FIGS. 5A-B may be used to secure the bottom frame structure 102 to a floor at a data center location.

In some embodiments, a bottom frame structure of a self-standing data center infrastructure system, such as bottom frame structure 102, may include horizontal structural members configured to secure racks to the bottom frame structure such that additional anchoring mechanisms are not needed to secure the racks in place. For example, bottom frame structure 102 includes upper horizontal structural members 112 and lower horizontal structural members 114. As discussed in more detail in FIGS. 6-12, various clip and/or fastener arrangements may be used to secure a rack to a bottom frame without using anchor bolts or other anchoring mechanisms to directly attach the rack to a floor at a data center. In some embodiments, eliminating a requirement to directly attach a rack to a floor at a data center via anchoring mechanisms may increase the speed at which racks can be installed in a data center and may reduce structural analysis and review associated with drilling into a concrete slab and inserting anchoring mechanisms such as expanding anchor bolts into the concrete slab. Also, such an arrangement may reduce the need to install pre-set anchoring bolts in the concrete slab. In some embodiments, horizontal structural member 114 may be flush with the floor. In some embodiments, horizontal structural member 114 may include one or more plates and may be anchored to the floor separately or in addition to bottom frame structure 102. For example, in some embodiments, horizontal structural member 114 may be a horizontal rail that is separate from bottom frame structure 102 and that is anchored to the floor in a space within or adjacent to bottom frame structure 102. In some embodiments, horizontal structural member 114 may include additional anchoring points to a floor along the length of the horizontal structural member 114, for example at intervals along its length. In some embodiments "L" shaped brackets may be anchored to the floor via anchor bolts and the "L" shaped brackets may attach to the horizontal structural member 114 at intervals along the length of the horizontal structural member 114 to anchor the horizontal structural member 114 in place and to the floor.

Figure 1D:
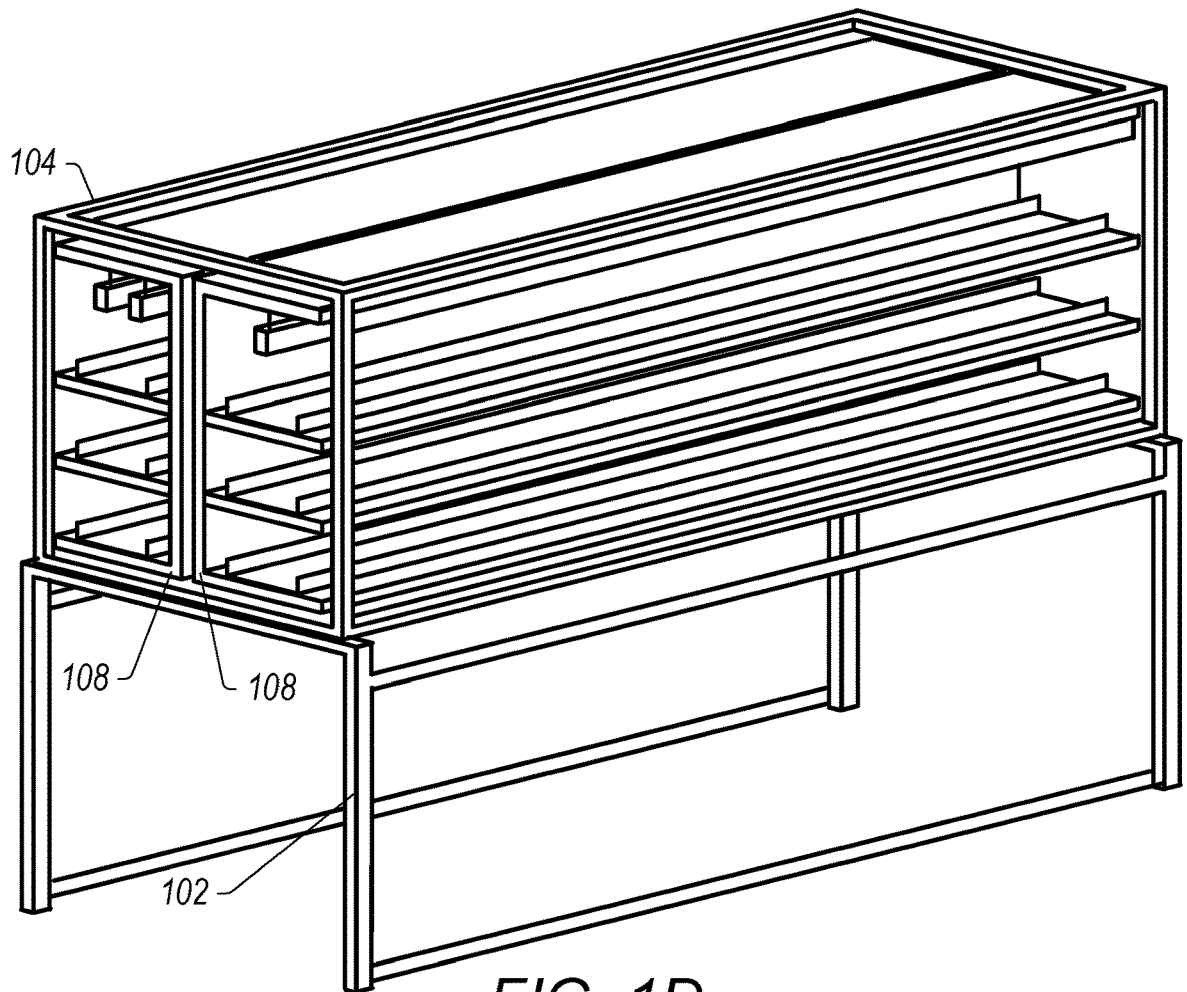
FIG. 1D illustrates a perspective view of a top frame of a self-standing modular data center infrastructure system that has been mounted on a bottom frame of the self-standing modular data center infrastructure system, wherein the top frame is in a collapsed configuration, according to some embodiments.

FIG. 1D illustrates a perspective view of a top frame of a self-standing modular data center infrastructure system that has been mounted on a bottom frame of the self-standing modular data center infrastructure system, wherein the top frame is in a collapsed configuration, according to some embodiments.

In some embodiments, a forklift may be used to place top frame structure 104 on bottom frame structure 102. For example, FIG. 1D illustrates top frame structure 104 mounted on bottom frame structure 102, wherein the moveable frame elements 108 of top frame structure 104 are in a collapsed configuration. In some embodiments, top frame structure 104 may include one or more slots or brackets to accept the forks of a forklift, and/or may include other lifting connectors.

Figure 1E:
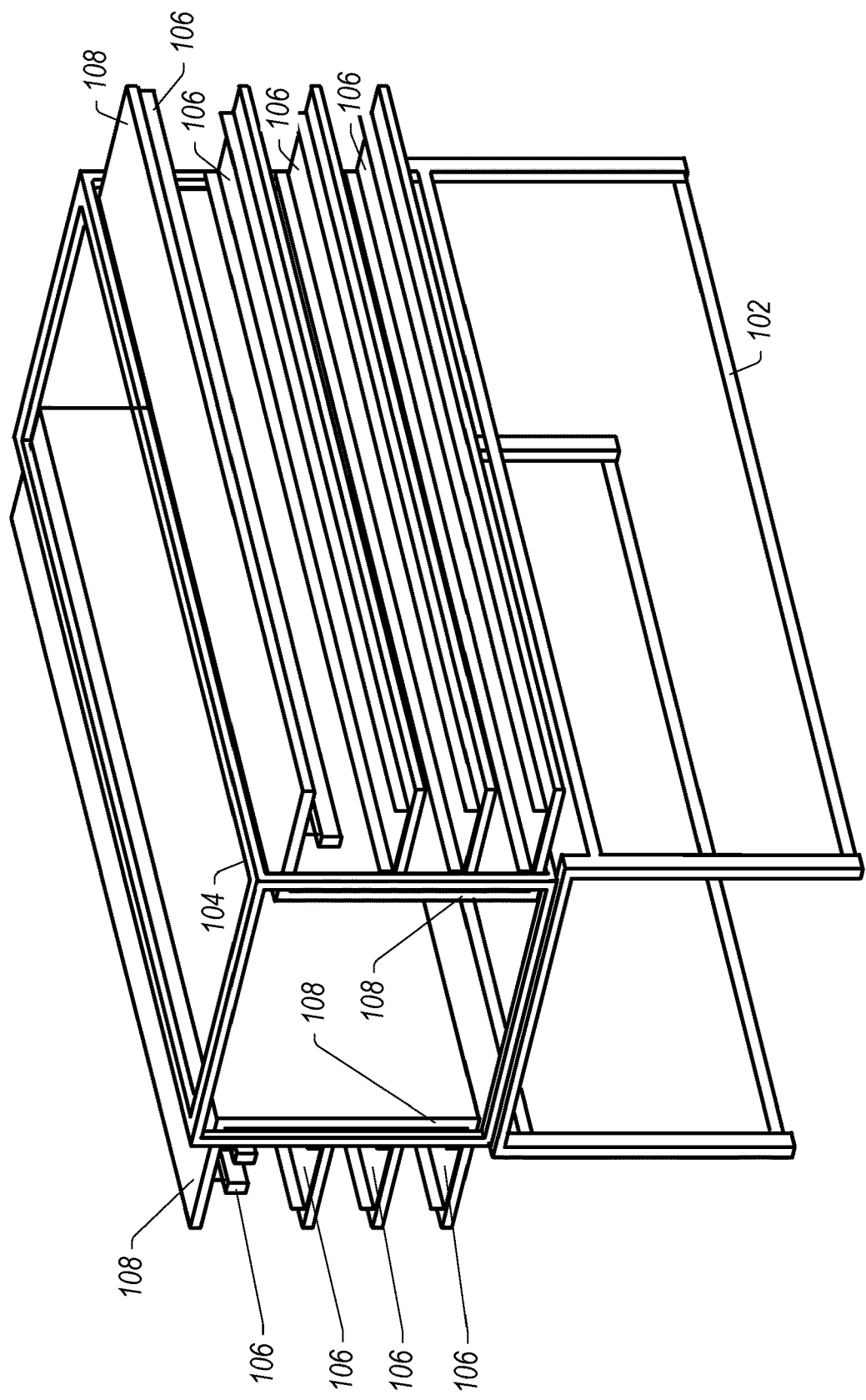
FIG. 1E illustrates a perspective view of a self-standing modular data center infrastructure system with a top frame of the self-standing modular data center infrastructure system in an expanded configuration, according to some embodiments.

FIG. 1E illustrates a perspective view of a self-standing modular data center infrastructure system with a top frame of the self-standing modular data center infrastructure system in an expanded configuration, according to some embodiments.

In some embodiments, a top frame structure, such as top frame structure 104, may be secured to a bottom frame structure, such as bottom frame structure 102, via pins, bolts, or other types of fasteners or connectors. Once securely mounted on the bottom frame structure, the top frame structure may be expanded into an expanded configuration. For example, moveable frame elements 108 of top frame structure 104 may be translated away from a center portion of the top frame structure 104 to cause the infrastructure systems 106 mechanically coupled to the moveable frame elements 108 to be positioned over a portion of an aisle adjacent to the self-standing data center infrastructure system.

Figure 1F:
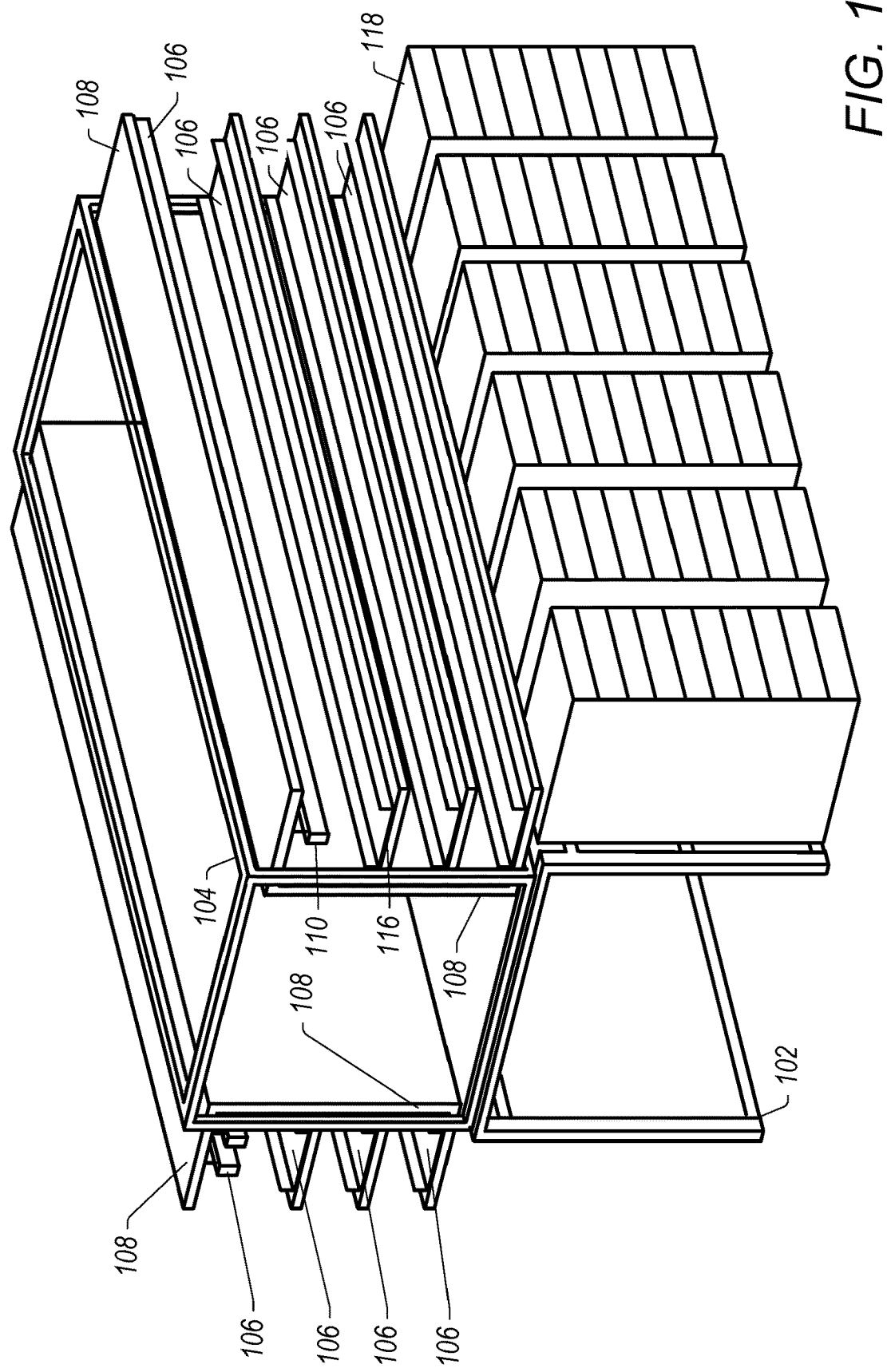
FIG. 1F illustrates a perspective view of a self-standing modular data center infrastructure system and racks comprising rack-mounted computing systems mounted to the self-standing data center infrastructure system, according to some embodiments.

FIG. 1F illustrates a perspective view of a self-standing modular data center infrastructure system and racks comprising rack-mounted computing systems mounted to the self-standing data center infrastructure system, according to some embodiments.

In some embodiments a row of racks 118 may be secured to either side of the bottom frame structure 102, wherein the infrastructure systems 106 that have been translated out from the top frame structure 104 provide infrastructure support to the rows of racks 118. For example, a power busway 110 and/or a cable tray 116 may provide infrastructure support to the row of racks 118. For example, power busway 110 may distribute electrical power to rack-mounted computer systems mounted in the racks of the row of racks 118. Also, cable trays 116 may support cables that connect to rack mounted computer system mounted in the racks of the row of racks 118. In some embodiments, the racks 118 may be mounted to the bottom frame structure 102 adjacent to one another with minimal or no space between the racks 118. For example, the racks 118 may collectively form an air containment barrier that prevents hot air on an exhaust side of the racks from traveling between the racks to a cold air inlet side of the racks. In some embodiments, there may be a clearance between the tops of the racks and the bottom cable trays 116. For example, there may be a six-inch gap between the tops of the racks 118 and the cable trays 116.

Figure 16:
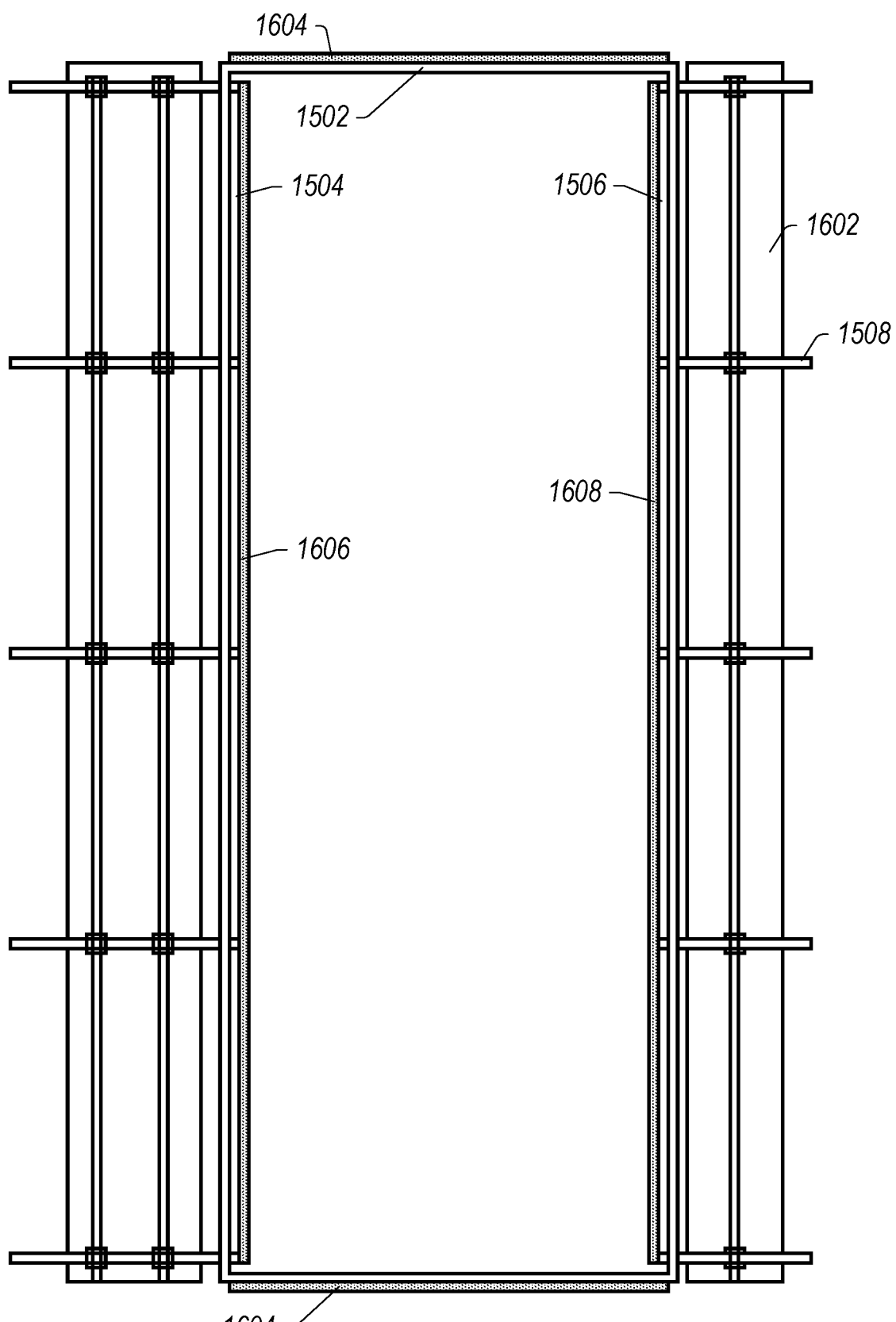
FIG. 16 illustrates a top view of a top frame of a self-standing data center infrastructure system, wherein the top frame is in an expanded configuration, according to some embodiments.

In some embodiments, the moveable frame elements of a top frame structure, such as moveable frame elements 108 of top frame structure 104, may extend a length of the top frame as shown in FIGS. 1A-1F. In some embodiments, the moveable frame elements of a top frame structure may include discrete frame elements that are spaced along a length of the top frame. For example, FIG. 16 illustrates discrete spaced moveable frame elements of a top frame structure. In some embodiments, additional moveable frame elements may be added to a top frame structure to increase a load carrying capacity of the top frame structure. For example, to support cable trays with a greater number or weight of cables in the cable trays.

Figures 2A, 2B:
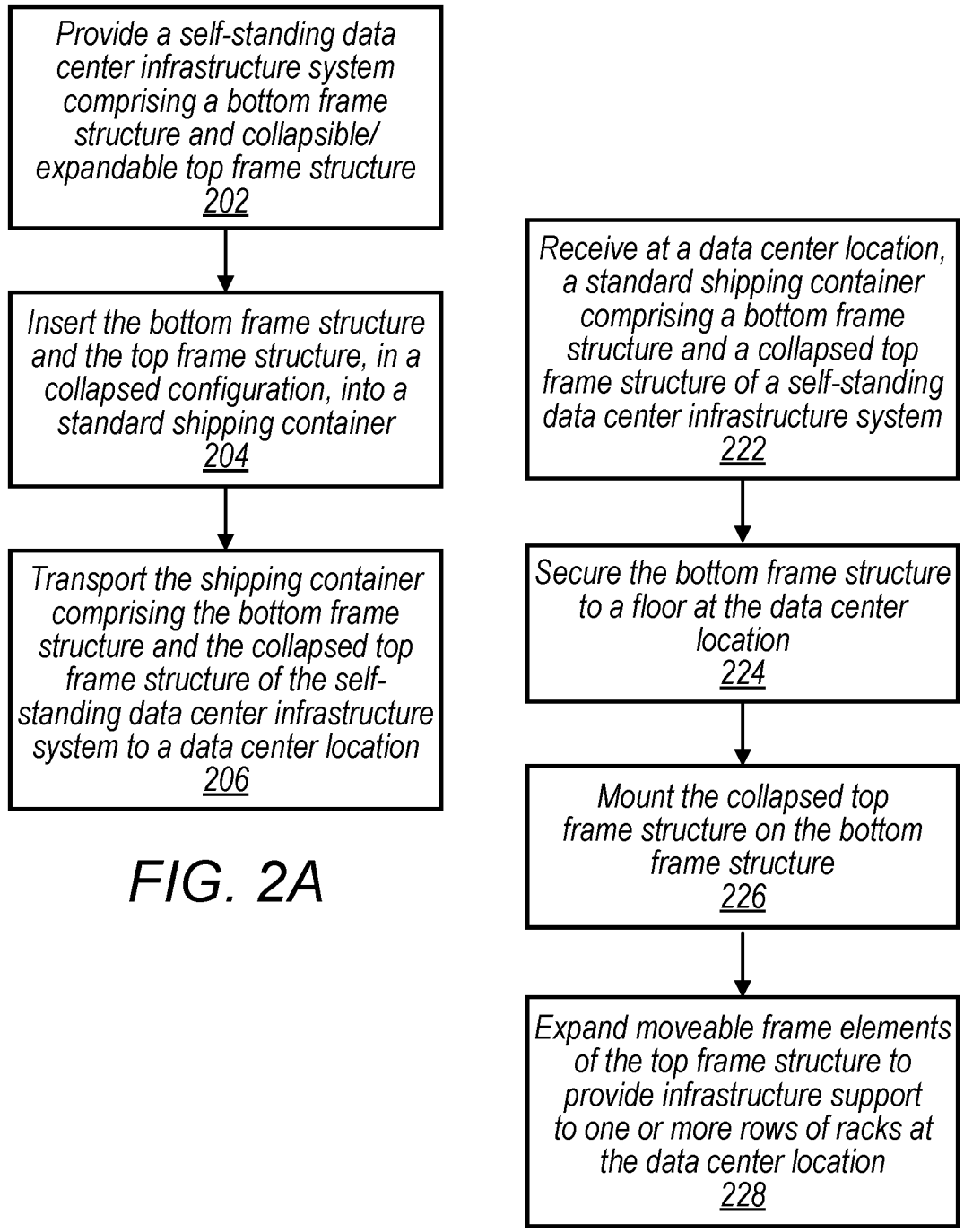
FIG. 2A illustrates a flow chart for providing a self-standing data center infrastructure system and transporting the self-standing data center infrastructure system to a data center location in a shipping container, according to some embodiments.
FIG. 2B illustrates a flow chart for receiving and installing a self-standing data center infrastructure system at a data center location, according to some embodiments.

FIG. 2A illustrates a flow chart for providing a self-standing data center infrastructure system and transporting the self-standing data center infrastructure system to a data center location in a shipping container, according to some embodiments.

At 202, a self-standing data center infrastructure system is provided. For example, a self-standing data center infrastructure system as illustrated in FIGS. 1A-F may be provided. In some embodiments, the self-standing data center infrastructure system may be fabricated off-site from a data center where the self-standing data center infrastructure system is to be installed or may otherwise be fabricated outside of a critical path for construction of the data center.

At 204, a top frame structure and a bottom frame structure of the self-standing data center infrastructure system are inserted into a standard shipping container. The top frame structure is in a collapsed configuration when inserted into the standard shipping container. In some embodiments, the bottom frame structure may be inserted in the standard shipping container as a single complete piece, or may be broken down into multiple pieces that are inserted into the standard shipping container, wherein the multiple pieces are re-assembled at a data center location where the self-standing data center infrastructure system is to be installed. In some embodiments, more than one standard shipping container may be used to transport the top and bottom frame.

At 206, the self-standing data center infrastructure system including the top frame structure, the bottom frame structure, and any other components, such as clips, bolts, additional horizontal structural members or vertical support columns to be attached to the bottom frame structure, etc. are transported to a data center location for installation in the standard shipping container.

FIG. 2B illustrates a flow chart for receiving and installing a self-standing data center infrastructure system at a data center location, according to some embodiments.

At 222, a standard shipping container comprising a self-standing data center infrastructure system is received at a data center location. The shipping container includes a top frame structure, a bottom frame structure, and any other components of the self-standing data center infrastructure system, such as clips, bolts, additional horizontal structural members or vertical support columns to be attached to the bottom frame structure, etc. In some embodiments, all of the components necessary to install a self-standing data center infrastructure system may be included in a single shipping container. While, in other embodiments, some components, such as clips, bolts, anchoring mechanisms, etc. may be delivered to a data center location separately from a standard shipping container that transports the self-standing data center system to the data center location. In some embodiments, the bottom frame and additional components, such as clips, bolts, anchoring mechanisms, etc. may be included in a separate standard shipping container from a standard shipping container that includes the top frame.

At 224, the bottom frame structure of the self-standing data center infrastructure system is removed from the standard shipping container and secured to a floor at the data center location. For example, a forklift, crane, or other device may be used to remove the bottom frame structure from the standard shipping container and place the bottom frame structure at an installation location in the data center for the self-standing data center infrastructure system. In some embodiments, the bottom frame structure, once installation is complete, may form a structure for a hot aisle in the data center. For example, rows of racks may be secured to either side of the length of the bottom frame structure and air containment panels may be mounted on the ends of the bottom frame structure.

In some embodiments, the bottom frame structure may be placed on pre-set anchor bolts that are anchored into a concrete slab. Also, in some embodiments, expanding anchor bolts may be inserted through holes in a feet plates of a bottom frame structure to secure the bottom frame structure to a floor of a data center.

At 226, a top frame structure of the self-standing data center infrastructure system may be removed from the standard shipping container and mounted on the bottom frame structure that has been secured to the floor of the data center. In some embodiments, a forklift, crane, or other device may remove the top frame structure from the standard shipping container and place the top frame structure on the bottom frame structure. In some embodiments, pins, bolts, or other fasteners may be used to secure the top frame structure to the bottom frame structure.

At 228, the top frame structure is expanded by translating the moveable frame elements of the top frame structure into an expanded configuration. In some embodiments, the top frame structure may be expanded prior to or after being mounted on the bottom frame structure. In the expanded configuration, the infrastructure systems mechanically coupled to the moveable frame elements (e.g., power busways, cable trays, etc.) may be positioned to support rack mounted computing system to be mounted below the infrastructure systems. For example, rows of racks as shown in FIG. 1F.

Figure 3:
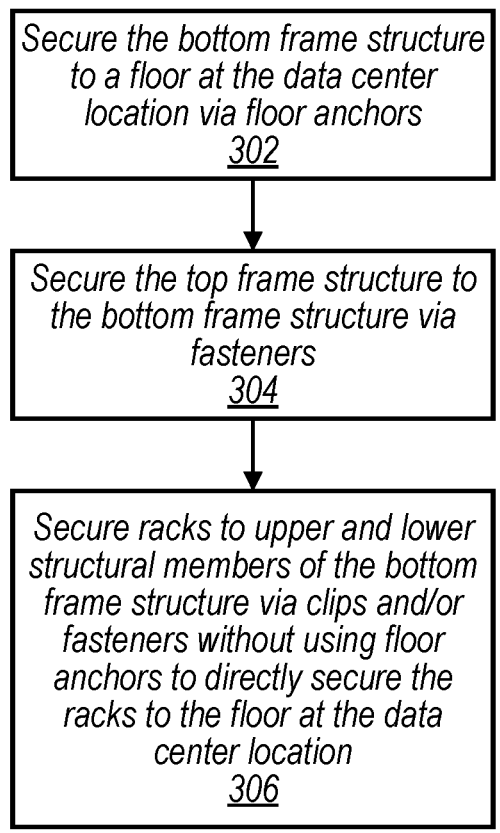
FIG. 3 illustrates a flow chart for securing a self-standing data center infrastructure system to a floor at a data center location and securing racks for rack-mounted computing systems to the self-standing data center infrastructure system, according to some embodiments.

FIG. 3 illustrates a flow chart for securing a self-standing data center infrastructure system to a floor at a data center location and securing racks for rack-mounted computing systems to the self-standing data center infrastructure system, according to some embodiments.

At 302, the bottom frame structure of a self-standing data center infrastructure system is attached to the floor of the data center via one or more anchoring mechanisms such that the bottom frame structure is secure to the floor.

At 304, the top frame structure of the self-standing data center infrastructure system is mounted on the bottom frame structure and attached to the bottom frame structure via one or more fasteners, such that the top frame structure is secured to the bottom frame structure. For example, in some embodiments, fasteners such as pins, bolts, screws, clips, or other types of fasteners may be used to secure a top frame structure to a bottom frame structure of a self-standing data center infrastructure system.

At 306, racks for rack-mounted computing systems are secured to the bottom frame structure that has been secured to the floor of the data center. Since the bottom frame structure is already secured to the floor of the data center, it is not necessary to directly secure the racks to the floor via anchor mechanisms, such as anchor bolts. Instead, a back vertical portion of the frame of the racks may be attached to the bottom frame structure via pre-drilled holes that are included in the racks. For example, one or more clips may be secured to a rack via one or more bolts, and the clip may also be secured to a frame element of the bottom frame structure, such as a horizontal structural element of the bottom frame structure. In some embodiments, clips may be attached to an upper portion of a back of a rack and a lower portion of a back of a rack. Such a configuration may secure the rack in two or more places along the height of the rack, such that seismic disruptions do not cause the rack to rock and "clap" against the bottom frame structure or adjacent racks. In some embodiments, clips may connect the rack to the bottom frame structure on two sides of the rack at the lower height and on two sides of the rack at the upper height. In this way the rack may be secured by at least four connections to the bottom frame structure, but without a direct connection coupling the rack to the floor of the data center (other than the weight of the rack pushing down against the floor).

Figure 4:
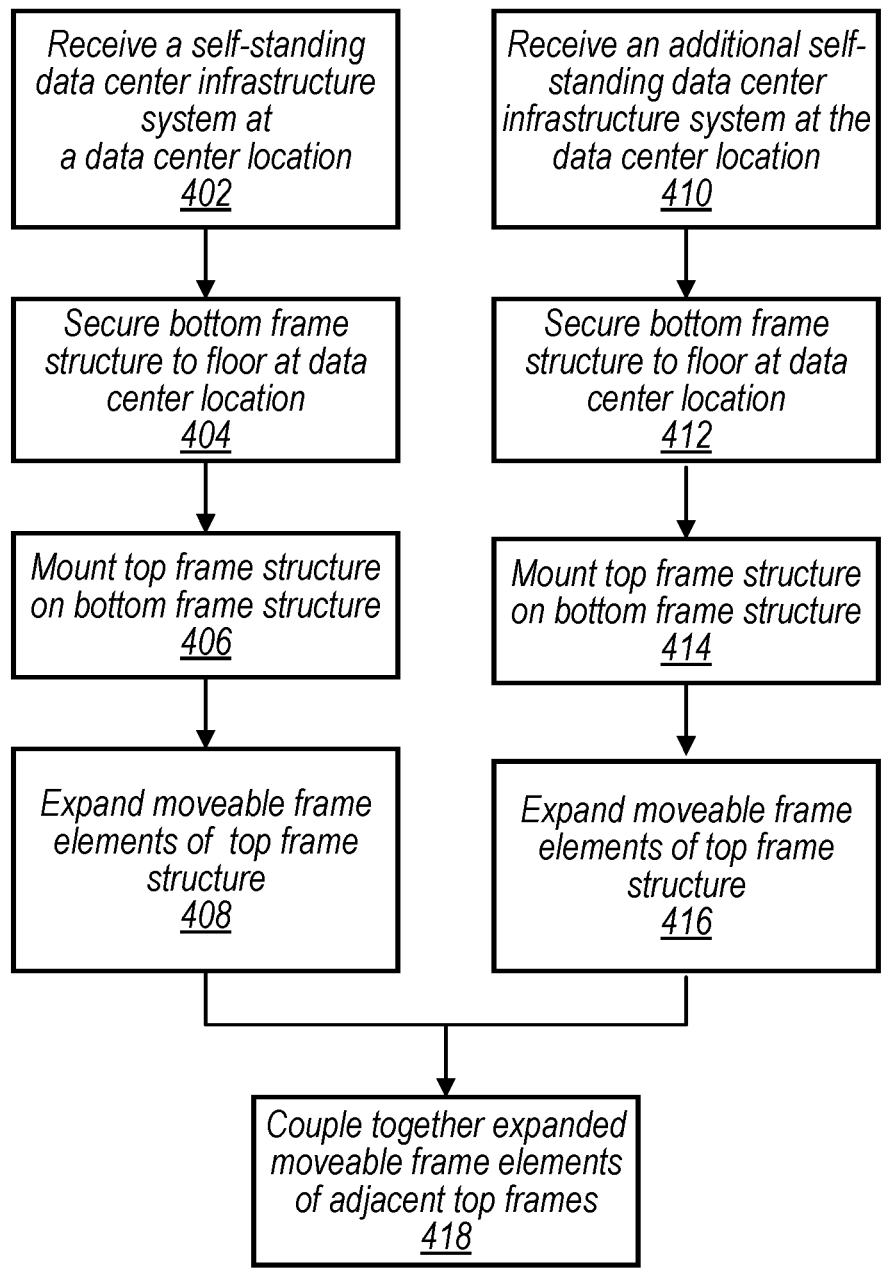
FIG. 4 illustrates a flow chart for installing multiple self-standing data center infrastructure systems at a data center location and coupling the self-standing data center infrastructure systems together, according to some embodiments.

FIG. 4 illustrates a flow chart for installing multiple self-standing data center infrastructure systems at a data center location and coupling the self-standing data center infrastructure systems together, according to some embodiments.

At 402 and 410 two or more self-standing data center infrastructure systems are received at a data center location. At 404-416 the self-standing data center infrastructure systems are installed at the data center location in adjacent positions in a similar manner as described above in regard to FIG. 2B and FIG. 3.

At 418, expanded moveable elements of the adjacent self-standing data center infrastructure systems are coupled together. For example, the adjacent self-standing data center infrastructure systems may be positioned in locations that correspond with hot aisles in a data center and a space between the adjacent self-standing data center infrastructure systems may correspond with a cold aisle in the data center. Moveable frame elopements of the self-standing data center infrastructure systems facing the cold aisle may be translated out into the cold aisle and may couple with corresponding moveable frame elements of the other self-standing data center infrastructure system on the other side of the cold aisle. In some embodiments, fasteners such as clips, bolts, pins, etc. may be used to couple the moveable frame elements together. In some embodiments, the adjacent self-standing data center infrastructure system may be positioned such that the moveable frame elements are slightly offset from one another such that the moveable frame elements may overlap one another when fully extended.

Figure 5A:
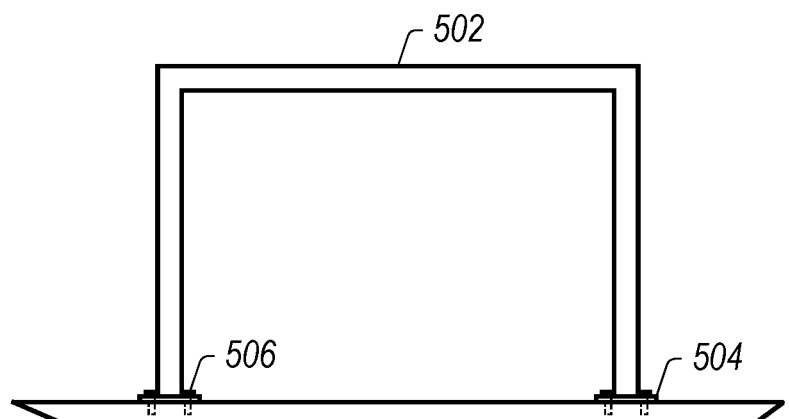
FIG. 5A illustrates an end view of a bottom frame of a self-standing data center infrastructure system, according to some embodiments.
Figure 5B:
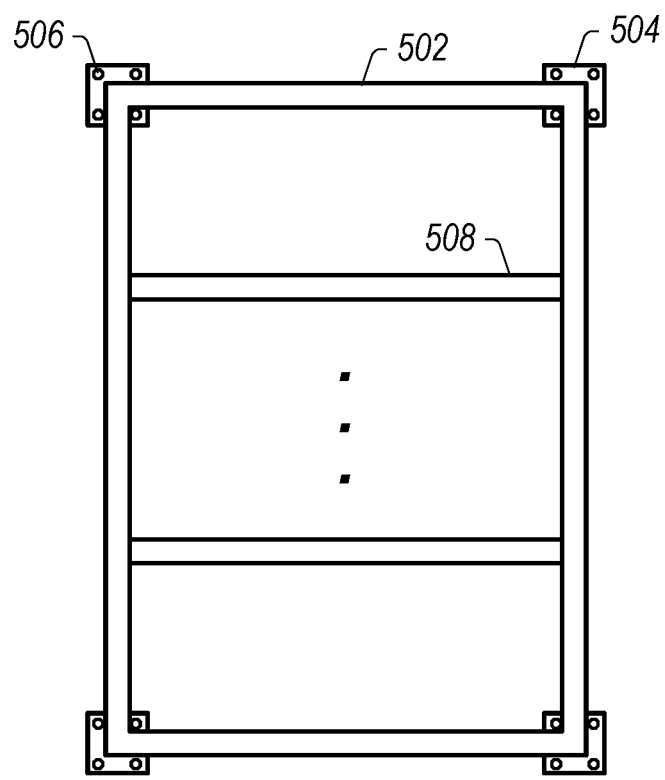
FIG. 5B illustrates a top view of a bottom frame of a self-standing data center infrastructure system, according to some embodiments.

FIG. 5A illustrates an end view of a bottom frame of a self-standing data center infrastructure system, according to some embodiments. FIG. 5B illustrates a top view of a bottom frame of a self-standing data center infrastructure system, according to some embodiments.

In some embodiments, a bottom frame structure of a self-standing data center infrastructure system, such as bottom frame structure 502, includes feet plates, such as feet plates 504. In some embodiments one or more anchor mechanisms, such as anchor bolts 506, may secure a bottom frame to a floor of a data center via the anchoring mechanism attaching feet plates of the bottom frame structure to the floor of the data center.

In some embodiments, a bottom frame structure, such as bottom frame structure 502, may optionally include additional top horizontal braces, such as braces 508.

In some embodiments "L" shaped brackets may be anchored to the floor via anchor bolts and the "L" shaped brackets may attach to the bottom frame structure 502, or a horizontal structural member of the bottom frame structure, at intervals along the length of the horizontal structural member to anchor the horizontal structural member in place and to the floor. In some embodiments "L" shaped brackets may attach to the sides of vertical beams (not shown) that align with braces 508.

In some embodiments, a bottom frame structure, such as bottom frame structure 502, may be configured to be modified to support more load/weight. For example, in some embodiments, additional "L" shaped brackets, vertical beams, and braces, such as braces 508, may be added at intervals between existing "L" shaped brackets, vertical beams, and braces to increase a load carrying capacity of the bottom frame structure.

Figure 5C:
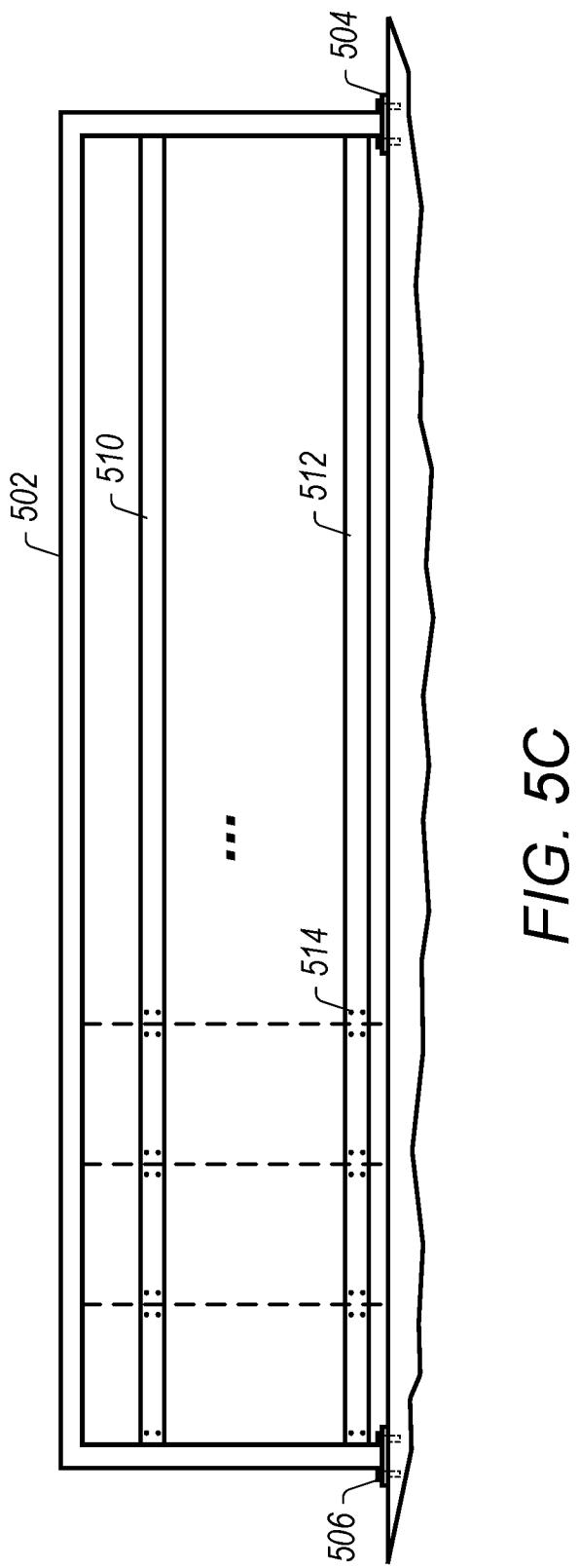
FIG. 5C illustrates a side view of a bottom frame of a self-standing data center infrastructure system, according to some embodiments.

FIG. 5C illustrates a side view of a bottom frame of a self-standing data center infrastructure system, according to some embodiments.

In some embodiments, a bottom frame structure of a self-standing data center infrastructure system, such as bottom frame structure 502, may further include horizontal structural members configured to attach and secure racks to the bottom frame structure. For example, bottom frame structure 502 includes an upper horizontal structural member 510 and a lower horizontal structural member 512. In some embodiments, horizontal structural members, such as upper horizontal structural member 510 and lower horizontal structural member 512 may include connections points 514 configured to accept connections via clips or fasteners that connect the racks to the horizontal structural members. As discussed in FIGS. 6-12 various clip and/or fastener arrangements may be used to secure racks to a bottom frame structure of a self-standing data center infrastructure system.

Figure 6A:
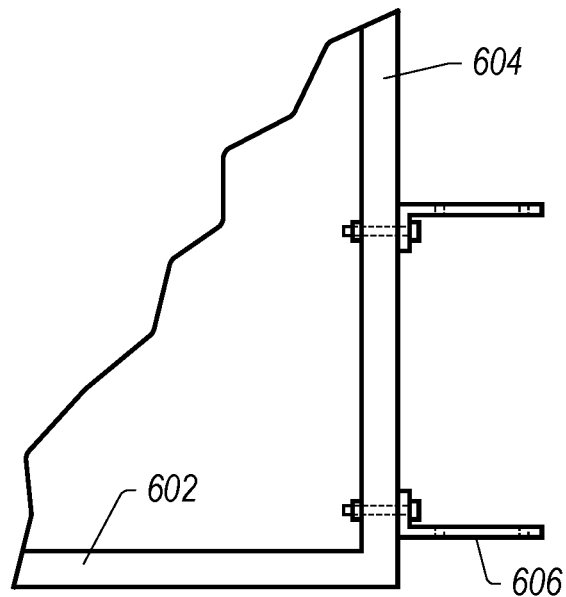
FIG. 6A illustrates a top view of clips that attach a rack to a bottom frame of a self-standing data center infrastructure system, according to some embodiments.
Figure 6B:
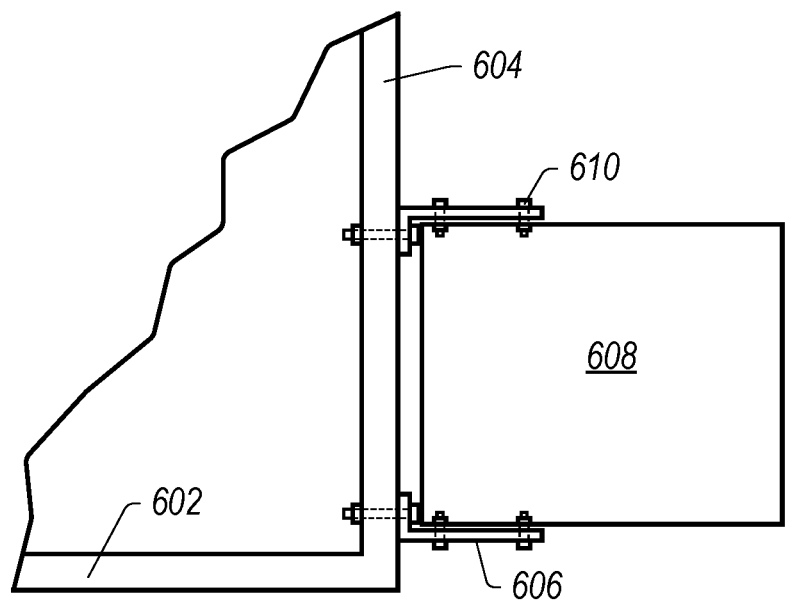
FIG. 6B illustrates a top view a rack attached to a bottom frame of a self-standing data center infrastructure system via clips, according to some embodiments.

FIGS. 6A-6B illustrate a top view of clips that attach a rack to a bottom frame of a self-standing data center infrastructure system, according to some embodiments.

In some embodiments, clips, such as clips 606, may be attached to a horizontal structural member of a bottom frame of a self-standing data center infrastructure system. For example, clips 606 may be attached to horizontal structural member 604 of bottom frame 602. In some embodiments, horizontal structural member 604 may be a same or similar horizontal structural member as horizontal structural members 510 and 512 illustrated in FIG. 5C.

In some embodiments, a rack may further be attached to the clips that have been attached to the horizontal structural members. For example, rack 608 is attached to clips 606 via one or more fasteners 610. In some embodiments, fasteners, such as fasteners 610, may also be used to secure clips, such as clips 606, to a bottom frame, such as bottom frame 602 and/or horizontal structural members of a bottom frame such as horizontal structural member 604 of bottom frame 602.

FIG. 7A illustrates a side view of another arrangement of clips that attach a rack to a bottom frame of a self-standing data center infrastructure system, according to some embodiments. FIG. 7B illustrates a side view of an alternative arrangement of clips that attach a rack to a bottom frame of a self-standing data center infrastructure system, according to some embodiments. FIG. 7C illustrates a side view of a bottom frame of a self-standing data center infrastructure system that includes horizontal structural members configured to secure racks in place, according to some embodiments.

In some embodiments, clips used to secure a rack to a bottom frame may be configured for ease of re-use. For example, FIG. 7A illustrates an alternative clip arrangement wherein a first set of clips 704 are attached to horizontal structural member 702 and a second set of clips 706 are attached to rack 708. The first and second set of clips may further be coupled together via fasteners to secure the rack to the bottom frame. In some embodiments, the clips 704 may extend through a slot 714 in the horizontal structural member 702 such that a set-back position of the clips 704 and by extension rack 708 may be adjusted. In some embodiments, the clips 706 may slide along a top and a bottom outer frame of rack 708. In some embodiments, clips 706 may be secured to rack 708 via bolts as shown in FIG.

7A, and in other embodiments the clips 706 may prevent rack 708 from tipping over, but may not be directly coupled to the rack via bolts.

In some embodiments, an additional bar 710 (as shown in FIG. 7B) may connect to clips 704 and an additional clip 718 may connect the bar 710 to horizontal structural members 702.

In some embodiments, bolts or other fasteners may be used to secure clips to a rack and a bottom frame structure. In some embodiments, the bolts may be placed with some "slop" (e.g., spacing) such that the rack cannot tip over and the clips cannot separate from the horizontal structure, but the placement of the bolts may allow for some movement (for example as shown in FIGS. 7A and 7B).

In some embodiments, horizontal structural members may be separate components of a self-standing data center infrastructure system. For example, in some embodiments one or more bolts 712 may be used to attach a horizontal structural member such as horizontal structural member 702 to a vertical column of a bottom frame, such as vertical column 716. Also, in some embodiments vertical beams 716 may be separate components of a self-standing data center infrastructure system, and may be added during installation at a data center location. In some embodiments, braces, such as braces 508 shown in FIG. 5B, may be separate components that are installed at a data center location. Also, as discussed above, in some embodiments, vertical beams, braces, and/or additional mounting brackets (e.g., "L" shaped brackets) may be added to an installed self-standing data center infrastructure system to increase a load carrying capacity of the self-standing data center infrastructure system.

FIG. 8 illustrates a top sectional view of another example connection between a horizontal structural member of a bottom frame of a self-standing data center infrastructure system and a vertical support column, according to some embodiments.

In some embodiments, clips may be used to attach a horizontal structural member to a bottom frame of a self-standing data center infrastructure system. In some embodiments, the clips may allow a setback distance of the horizontal structural member to be adjustable. In some embodiments, adjustment of the setback distance of a horizontal structural member may allow racks of various sizes to be positioned in a row and align with other components in the data center. For example, horizontal structural member 804 is attached to vertical column 806 of bottom frame 802 via clips 808 and fasteners 810. Wherein clips 808 and fasteners 810 allow a setback distance of the horizontal structural member 804 to be adjusted. In some embodiments clip 808 extends through a slot in horizontal structural member 804 and fasteners 810 secure the horizontal structural member 804 to the clip 808 at a setback distance along the clip 808 based on how for or not the clip 808 has been inserted into the slot of the horizontal structural member 804.

FIG. 9 illustrates a side view of another arrangement of clips that attach a rack to a bottom frame of a self-standing data center infrastructure system, according to some embodiments.

In some embodiments, clips, such as clips 904 may be inserted into a slot of a bar 908 that is coupled to a horizontal structural member 902 and may allow for an adjustable setback distance of a rack, such as rack 906.

FIG. 10 illustrates a side view of another arrangement of clips that attach a rack to a bottom frame of a self-standing data center infrastructure system or to a vertical support column attached to the bottom frame, according to some embodiments.

In some embodiments, clips may be used to directly attach and secure one or more racks to a bottom frame without using horizontal structural members as shown in FIGS. 5C and 7C. Or, in some embodiments, clips as shown in FIG. 10 may be used in addition to horizontal structural members as shown in FIGS. 5C and 7C.

For example, clips 1002 and 1004 may attach to one another and attach a rack 1008 to a horizontal structural member 1006 of a bottom frame structure. In some embodiments, multiple sets of clips 1002 and 1004 may attach multiple racks together. For example, another rack 1008 may be attached to the right or left of rack 1008.

Figure 11:
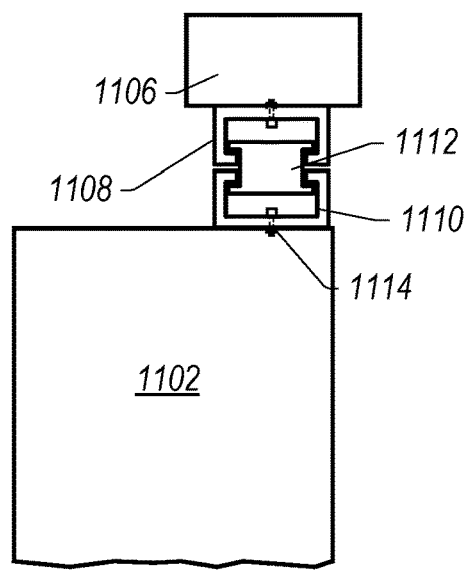
FIG. 11 illustrates a side sectional view of clips that secure a rack to a bottom frame of a self-standing data center infrastructure system, according to some embodiments.

FIG. 11 illustrates a side sectional view of clips that secure a rack to a bottom frame of a self-standing data center infrastructure system, according to some embodiments.

In some embodiments, other configurations may be used to connect racks to a bottom frame. For example, FIG. 11 illustrates two horizontal pieces of "unistrut" that are used to attach rack 1102 to horizontal structural member 1106 of a bottom frame structure. For example, unistrut member 1108 is attached to horizontal structural member 1106 via fasteners 1114. Also, unistrut member 1110 is attached to rack 1102 via fasteners 1114. The open ends of the adjacent pieces of unistrut face each other and a bracket 1112 slides into the open ends of the unistrut and overlaps a lip of the unistrut pieces such that they cannot pull away from one another. In some embodiments, a bolt, pin, or other fastener may hold bracket 1112 in place.

Figure 12:
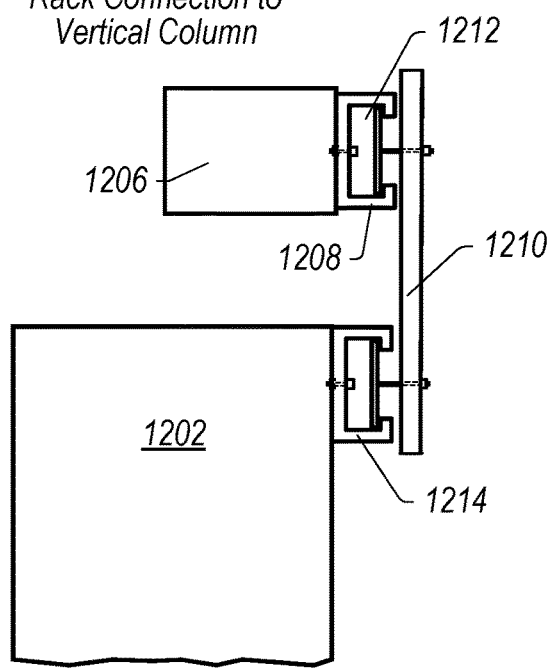
FIG. 12 illustrates a side sectional view of clips that secure a rack to a horizontal structural member of a bottom frame of a self-standing data center infrastructure system, according to some embodiments.

FIG. 12 illustrates a side sectional view of clips that secure a rack to a horizontal structural member of a bottom frame of a self-standing data center infrastructure system, according to some embodiments.

In some embodiments, a piece of unistrut 1208 may be attached to a horizontal structural member 1206 of a bottom frame structure. Also, a piece of unistrut 1214 may be attached to the back of rack 1202. Respective brackets 1212 may engage with the open ends of the pieces of unistrut and attach the pieces of unistrut to vertical structural member 1210. In some embodiments, vertical structural member 1210 may be an additional piece of unistrut.

Figure 13:
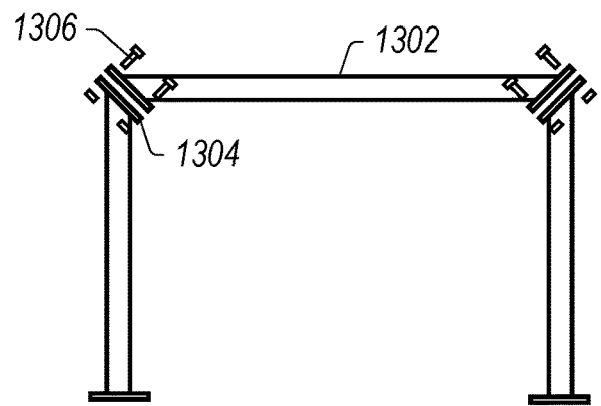
FIG. 13 illustrates an end view of a bottom frame of a self-standing data center infrastructure system, wherein the bottom frame is configured to be transported in multiple pieces, according to some embodiments.

FIG. 13 illustrates an end view of a bottom frame of a self-standing data center infrastructure system, wherein the bottom frame is configured to be transported in multiple pieces, according to some embodiments.

In some embodiments, a bottom frame structure of a self-standing data center infrastructure system may be configured to be transported in multiple pieces and re-assembled at a data center location. For example, bottom frame structure 1302 includes flanges 1304 and bolts 1306 which allow the bottom frame structure 1302 to be shipped in multiple pieces and quickly re-assembled at a data center location.

Figure 14A:
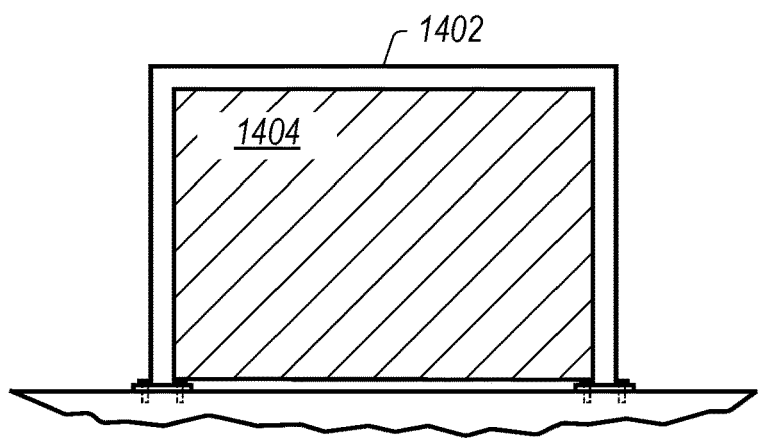
FIG. 14A illustrates an end view of a bottom frame of a self-standing data center infrastructure system, wherein the bottom frame includes air containment panels, according to some embodiments.

FIG. 14A illustrates an end view of a bottom frame of a self-standing data center infrastructure system, wherein the bottom frame includes air containment panels, according to some embodiments.

In some embodiments, a bottom frame structure may include one or more air containment panels that prevent air exhausted into a hot aisle enclosed by the self-standing data center infrastructure system to mix with other air in the data center, such as air in a cold aisle. For example, bottom frame structure 1402 includes air containment panels 1404 on either open end of the bottom frame structure 1402.

Figure 14B:
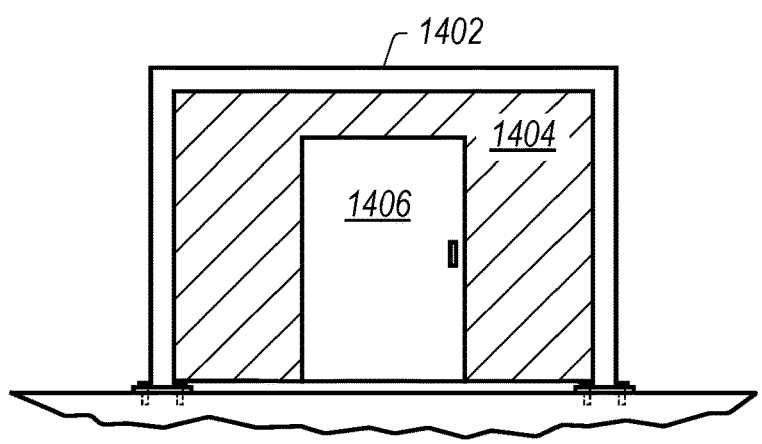
FIG. 14B illustrates an end view of a bottom frame of a self-standing data center infrastructure system, wherein the bottom frame includes a door into a hot aisle, according to some embodiments.

FIG. 14B illustrates an end view of a bottom frame of a self-standing data center infrastructure system, wherein the bottom frame includes a door into a hot aisle, according to some embodiments.

In some embodiments, an air containment panel of a bottom frame structure may further include a door for accessing a hot aisle enclosed by the bottom frame structure. For example, bottom frame structure 1402 includes door 1406 in air containment panel 1404.

Figure 15A:
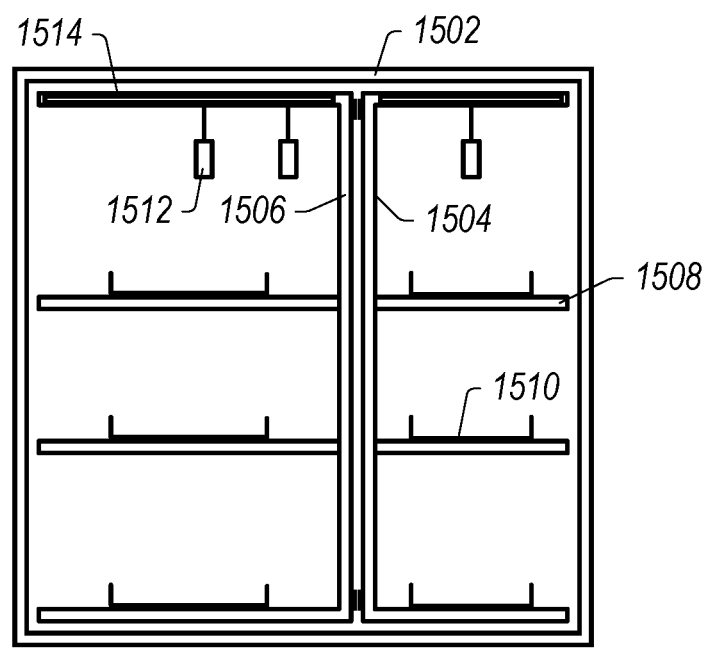
FIG. 15A illustrates an end view of a top frame of a self-standing data center infrastructure system, wherein the top frame is in a collapsed configuration, according to some embodiments.

FIG. 15A illustrates an end view of top frame of a self-standing data center infrastructure system, wherein the top frame is in a collapsed configuration, according to some embodiments.

In some embodiments, a top frame structure of a self-standing data center infrastructure system, such as top frame 1502, includes moveable frame elements, such as moveable frame elements 1504 and 1506. In some embodiments, moveable frame elements 1504 and 1506 may include multiple supports 1508 to which infrastructure systems are mechanically coupled. For example, cable trays 1510 and power busways 1512 are coupled to supports 1508. In some embodiments, supports 1508 may include a telescoping support or other type of retractable support, such as telescoping support member 1514.

In some embodiments, one set of movable frame elements of a top frame structure may include more power busways coupled to it than a set of moveable frame elements on another side of the top frame structure. For example, moveable frame elements 1506 have two power busways 1512 coupled to them, whereas moveable frame elements 1504 have a single power busway 1512 coupled to them. In some embodiments, the moveable frame elements may be off-center where one set is deeper than the other set, for example as shown in FIG. 15A. Also, in some embodiments opposing sets of moveable frame elements may be symmetrical about a center line of a top frame structure.

FIG. 15B illustrates an end view of top frame of a self-standing data center infrastructure system, wherein the top frame is in an expanded configuration, according to some embodiments.

In FIG. 15B, moveable frame elements 1504 and 1506 have been translated from a collapsed configuration as shown in FIG. 15A to an expanded configuration as shown in FIG. 15B. In some embodiments, moveable frame elements 1504 and 1506 may include stops 1516 that engage with top frame 1502 to prevent the moveable frame elements from translating out of top frame 1502. Additionally, in some embodiments, pins, fasteners or other mechanisms may be used to secure the moveable frame elements in an expanded configuration. In some embodiments, telescoping members 1514 may be further extended out of supports 1508 to position infrastructure systems, such as power busways 1512 in a desired location in a cold aisle adjacent to top frame structure 1502.

FIG. 16 illustrates a top view of a top frame of a self-standing data center infrastructure system, wherein the top frame is in an expanded configuration, according to some embodiments.

In some embodiments, supports 1508 may be placed at distances spaced along a length of a top frame structure 1502. In some embodiments, additional supports 1508 may be installed on a top frame structure 1502 to support greater loads. For example, more cables may be placed in cable tray 1602 due to an expansion of a data center location such that more supports 1508 are needed to support the weight of the cable tray 1602.

Also, as shown in FIG. 16, air containment panels, such as air containment panels 1604 may be attached to either end of a top frame structure 1502. Additionally, air containment panels may be attached to moveable frame elements 1504 and 1506, such as air containment panels 1606 and 1608. The air containment panel 1606 may move with moveable frame element 1504 and the air containment panel 1608 may move with the moveable air containment panel 1506. When in the expanded configuration, air containment panels 1604, 1606, and 1608 may enclose a hot aisle, along with air containment panels 1404 of a bottom frame structure.

Figure 17:
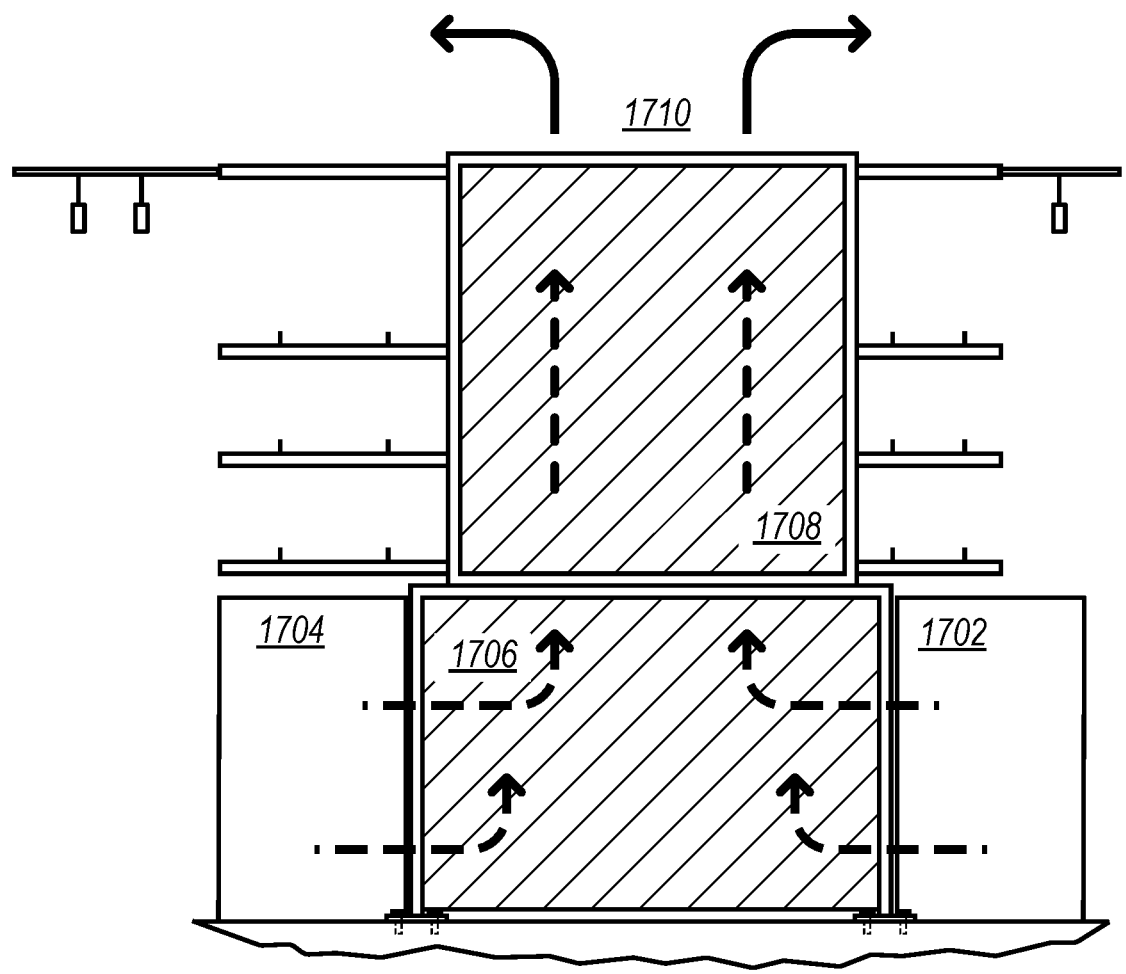
FIG. 17 illustrates an end view of a self-standing data center infrastructure system and air flow through the self-standing data center infrastructure system, according to some embodiments.

FIG. 17 illustrates an end view of a self-standing data center infrastructure system and air flow through the self-standing data center infrastructure system, according to some embodiments.

In some embodiments, heated air that has removed waste heat from computing devices mounted in racks, such as racks 1702 and 1704, may be directed into a hot aisle enclosed by bottom frame 1706 and up through top frame 1708 that also encloses the hot aisle and into an overhead duct or ceiling 1710 that receives the heated air.

In some embodiments, a top frame and bottom frame of a self-standing data center infrastructure system may be shipped with air containment panels and/or shipped with pre-installed air containment panels. The self-standing data center infrastructure system and associated air containment panels may allow for rapid installation of an enclosed hot aisle at a data center location.

The various methods as illustrated in the figures and described herein represent example embodiments of methods. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
    a floor;
    a frame structure, comprising:
        vertical columns; and
        horizontal structural members coupled between the vertical columns, wherein the horizontal structural members run along a length of the frame structure;
    anchoring mechanisms configured to secure the frame structure to the floor of the data center; and
    a plurality of racks comprising rack-mounted computing systems,
        wherein the racks are coupled to the frame structure and secured in place via the frame structure without using any additional anchoring mechanisms to directly secure the racks to the floor of the data center.

2. The data center of claim 1, further comprising:
    a top frame structure comprising:
        a static frame configured to mount on the frame structure anchored to the floor;
        moveable frame elements coupled to the static frame and configured to translate between a collapsed configuration and an expanded configuration;
        one or more cable trays mechanically coupled to the moveable frame elements; and
        one or more power busways mechanically coupled to the moveable frame elements, wherein the top frame structure mounted on the frame structure mounted to the floor form a free-standing structure in the data center.

3. The data center of claim 1, wherein the horizontal structural members of the frame structure comprise an upper horizontal structural member and a lower horizontal structural member, and
wherein respective ones of the racks are coupled to the frame structure at two or more places along respective heights of the respective racks via the upper horizontal structural member and the lower horizontal structural member of the frame structure.

4. The data center of claim 1, further comprising, for respective ones of the racks, a first set of clips coupled to the respective rack and a second set of clips coupled to one or more of the horizontal structural members of the frame structure,
wherein the first set of clips for the respective rack and the second set of clips for the respective rack are configured to couple to one another to secure the respective rack to the frame structure.

5. The data center of claim 4, wherein the first and second set of clips are arranged such that the plurality of racks are mounted to the frame structure adjacent to one another with minimal or no space between the racks, such that the racks collectively form an air containment barrier that prevents hot air on an exhaust side of the racks from traveling between the racks to a cold air inlet side of the racks.

6. A frame structure for mounting computing racks in a facility, the frame structure comprising:
vertical columns;
horizontal structural members coupled between the vertical columns, wherein the horizontal structural members run along a length of the frame structure; and
feet plates coupled to the vertical columns, wherein the feet plates are configured to accept anchoring mechanisms that secure the frame structure to a floor of the facility,
wherein the frame structure is configured to secure a plurality of computing racks in place via the horizontal structural members without using any additional anchoring mechanisms to directly secure the computing racks to the floor of the facility.

7. The frame structure of claim 6, wherein the horizontal structural members of the frame structure comprise an upper horizontal structural member and a lower horizontal structural member, and
wherein the upper horizontal structural member and the lower horizontal structural member are configured to couple with the computing racks such that the computing racks are coupled to the frame structure at two or more places along respective heights of the respective computing racks.

8. The frame structure of claim 7, further comprising, for respective ones of the computing racks, a set of clips configured to couple to a respective computing rack and configured to couple to one or more of the horizontal structural members of the frame structure.

9. The frame structure of claim 7, further comprising, for respective ones of the computing racks, a first set of clips configured to couple to a respective computing rack and a second set of clips configured to couple to one or more of the horizontal structural members of the frame structure,
wherein the first set of clips and the second set of clips are configured to couple to one another to secure the respective computing rack to the frame structure.

10. The frame structure of claim 9, wherein the first set of clips and the second set of clips couple directly with one another to secure the respective computing rack to the frame structure.

11. The frame structure of claim 9, further comprising a third set of clips and an additional bar, wherein the third set of clips couple to the second set of clips and couple to the additional bar, and wherein the first set of clips couple the horizontal frame structures to the additional bar,
wherein the additional bar runs vertically between the upper horizontal structural member and the lower horizontal structural member and enables varied height coupling of the respective computing rack to the frame structure.

12. The frame structure of claim 9, further comprising one or more vertical bars, wherein the one or more vertical bars comprise slots configured to accept the first set of clips and the second set of clips,
wherein the first set of clips, the second set of clips, and the one or more vertical bars are configured to enable adjustment of a setback distance of the respective computing rack relative to the frame structure.

13. The frame structure of claim 6, further comprising, for respective ones of the computing racks, a first set of clips configured to couple to a respective computing rack and a second set of clips configured to couple to a horizontal structural member of the frame structure,
wherein the first and second set of clips extend down from the horizontal structural member to enable coupling a computing rack with a height less than a height of the horizontal structure member to the frame structure.

14. The frame structure of claim 6, further comprising, for respective ones of the computing racks:
a first set of clips configured to couple to a respective computing rack;
a second set of clips configured to couple to a horizontal structural member of the frame structure; and
a bracket,
wherein:
the first set of clips extend up from the respective computing rack;
the second set of clips extend down from the horizontal structural member; and
the bracket couples the first set of clips to the second set of clips.

15. The frame structure of claim 6, further comprising, for respective ones of the computing racks:
a first set of clips configured to couple to a respective computing rack;
a second set of clips configured to couple to a horizontal structural member of the frame structure;
a vertical structural member;
an upper bracket configured to couple the first set of clips to the vertical structural member; and
a lower bracket configured to couple the second set of clips to the vertical structural member.

16. A method, comprising:
anchoring a frame structure to a floor of a facility with use of anchoring mechanisms, wherein the frame structure comprises:
vertical columns; and
horizontal structural members coupled between the vertical columns, wherein the horizontal structural members run along a length of the frame structure; and
securing a plurality of computing racks in place via the horizontal structural members of the frame structure without using any additional anchoring mechanisms to directly secure the computing racks to the floor of the facility.

17. The method of claim 16, further comprising:

mounting a top frame structure on the frame structure anchored to the floor, wherein the top frame structure comprises:
- a static frame configured to mount on the frame structure anchored to the floor;
- moveable frame elements coupled to the static frame and configured to translate between a collapsed configuration and an expanded configuration;
- one or more cable trays mechanically coupled to the moveable frame elements; and
- one or more power busways mechanically coupled to the moveable frame elements.

18. The method of claim 16, further comprising:

for a respective one of the computing racks,
- coupling a first set of clips to the respective computing rack;
- coupling a second set of clips to one or more of the horizontal structural members; and
- coupling the first and second set of clips to one another to secure the respective computing rack in place via the frame structure.

19. The method of claim 18, wherein the first set of clips and the second set of clips couple directly with one another to secure the respective computing rack to the frame structure.

20. The method of claim 16, further comprising:

for a respective one of the computing racks,
- coupling a set of clips to the respective computing rack; and
- coupling the set of clips to one or more of the horizontal structural members to secure the respective computing rack in place via the frame structure.

* * * * *